US010147660B2

(12) United States Patent
Spory

(10) Patent No.: US 10,147,660 B2
(45) Date of Patent: *Dec. 4, 2018

(54) REMAPPED PACKAGED EXTRACTED DIE WITH 3D PRINTED BOND CONNECTIONS

(71) Applicant: Erick Merle Spory, Colorado Springs, CO (US)

(72) Inventor: Erick Merle Spory, Colorado Springs, CO (US)

(73) Assignee: Global Circuits Innovations, Inc., Colorado Springs, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/792,381

(22) Filed: Oct. 24, 2017

(65) Prior Publication Data
US 2018/0040529 A1 Feb. 8, 2018

Related U.S. Application Data

(60) Continuation-in-part of application No. 14/600,733, filed on Jan. 20, 2015, now Pat. No. 9,824,948, which
(Continued)

(51) Int. Cl.
*H01L 23/20* (2006.01)
*H01L 23/00* (2006.01)
(Continued)

(52) U.S. Cl.
CPC .......... *H01L 23/20* (2013.01); *H01L 21/4803* (2013.01); *H01L 21/4817* (2013.01);
(Continued)

(58) Field of Classification Search
CPC ................. H01L 23/49513; H01L 23/49541
See application file for complete search history.

(56) References Cited

U.S. PATENT DOCUMENTS 4,012,832 A 3/1977 Crane
4,426,769 A 1/1984 Grabbe
(Continued)

FOREIGN PATENT DOCUMENTS

WO WO2011-101272 A1 8/2011

OTHER PUBLICATIONS

Official Action for U.S. Appl. No. 14/565,626, dated Aug. 28, 2015.
(Continued)

*Primary Examiner* — Matthew L Reames
*Assistant Examiner* — Wilner Jean Baptiste
(74) *Attorney, Agent, or Firm* — Thomas J. Lavan

(57) ABSTRACT

An integrated circuit is provided. The integrated circuit includes a package base including package leads, an extracted die removed from a previous packaged integrated circuit, and an an interposer bonded to the extracted die and the package base. The extracted die includes original bond pads and one or more original ball bonds on the original bond pads. The interposer includes first bond pads electrically connected to the original bond pads with 3D printed first bond connections conforming to the shapes and surfaces of the extracted die and the interposer and second bond pads electrically connected to the package leads with 3D printed second bond connections conforming to shapes and surfaces of the interposer and package base.

19 Claims, 21 Drawing Sheets

Related U.S. Application Data is a division of application No. 14/142,823, filed on Dec. 28, 2013, now Pat. No. 9,935,028, which is a continuation-in-part of application No. 13/785,959, filed on Mar. 5, 2013, now Pat. No. 9,966,319, which is a continuation-in-part of application No. 13/623,603, filed on Sep. 20, 2012, which is a continuation of application No. 13/283,293, filed on Oct. 27, 2011.

(51) Int. Cl.

| | | |
|---|---|---|
| *H01L 21/48* | (2006.01) | |
| *H01L 23/04* | (2006.01) | |
| *H01L 23/495* | (2006.01) | |
| *H01L 23/498* | (2006.01) | |
| *H01L 21/50* | (2006.01) | |
| *H01L 23/26* | (2006.01) | |
| *H01L 23/10* | (2006.01) | |
| *H01L 23/057* | (2006.01) | |

(52) U.S. Cl.
CPC .......... *H01L 21/4867* (2013.01); *H01L 21/50* (2013.01); *H01L 23/04* (2013.01); *H01L 23/26* (2013.01); *H01L 23/49513* (2013.01); *H01L 23/49541* (2013.01); *H01L 23/49838* (2013.01); *H01L 23/49861* (2013.01); *H01L 24/24* (2013.01); *H01L 24/25* (2013.01); *H01L 24/27* (2013.01); *H01L 24/29* (2013.01); *H01L 24/32* (2013.01); *H01L 24/82* (2013.01); *H01L 24/83* (2013.01); *H01L 23/057* (2013.01); *H01L 23/10* (2013.01); *H01L 23/564* (2013.01); *H01L 2224/245* (2013.01); *H01L 2224/24011* (2013.01); *H01L 2224/24051* (2013.01); *H01L 2224/24175* (2013.01); *H01L 2224/25171* (2013.01); *H01L 2224/2731* (2013.01); *H01L 2224/2919* (2013.01); *H01L 2224/29124* (2013.01); *H01L 2224/29144* (2013.01); *H01L 2224/29147* (2013.01); *H01L 2224/32225* (2013.01); *H01L 2224/32245* (2013.01); *H01L 2224/48* (2013.01); *H01L 2224/82102* (2013.01); *H01L 2224/82103* (2013.01); *H01L 2224/82214* (2013.01); *H01L 2224/82815* (2013.01); *H01L 2224/838* (2013.01); *H01L 2224/8385* (2013.01); *H01L 2224/83192* (2013.01); *H01L 2224/92247* (2013.01); *H01L 2924/00* (2013.01); *H01L 2924/00014* (2013.01); *H01L 2924/00015* (2013.01); *H01L 2924/01013* (2013.01); *H01L 2924/01029* (2013.01); *H01L 2924/01047* (2013.01); *H01L 2924/01079* (2013.01); *H01L 2924/12042* (2013.01); *H01L 2924/14* (2013.01); *H01L 2924/157* (2013.01); *H01L 2924/15787* (2013.01); *H01L 2924/15788* (2013.01); *H01L 2924/181* (2013.01); *H01L 2924/3656* (2013.01); *H01L 2924/3861* (2013.01)

(56) References Cited

U.S. PATENT DOCUMENTS

| | | | |
|---|---|---|---|
| 4,622,433 A | 11/1986 | Frampton | |
| 5,064,782 A | 11/1991 | Nishiguchi | |
| 5,219,794 A | 6/1993 | Satoh | |
| 5,243,756 A | 9/1993 | Hamburgen et al. | |
| 5,517,127 A | 5/1996 | Bergeron | |
| 5,598,031 A | 1/1997 | Groover et al. | |
| 5,783,464 A | 7/1998 | Burns | |
| 5,783,868 A | 7/1998 | Galloway | |
| 5,847,467 A | 12/1998 | Wills | |
| 5,936,758 A | 8/1999 | Fisher et al. | |
| 6,100,108 A | 8/2000 | Mizuno et al. | |
| 6,100,581 A | 8/2000 | Wakefield et al. | |
| 6,169,331 B1 | 1/2001 | Manning | |
| 6,429,028 B1 | 8/2002 | Young | |
| 6,472,725 B1 | 10/2002 | Stroupe | |
| 6,501,663 B1* | 12/2002 | Pan | H01L 21/288 174/260 |
| 7,067,332 B1 | 6/2006 | Chowdhury | |
| 7,160,368 B1 | 1/2007 | Wakelin | |
| 7,294,533 B2 | 11/2007 | Lebonheur | |
| 7,759,800 B2 | 7/2010 | Rigg et al. | |
| 7,883,880 B1 | 2/2011 | Davila et al. | |
| 7,888,806 B2* | 2/2011 | Lee | H01L 23/522 257/686 |
| 8,421,227 B2 | 4/2013 | Lin | |
| 8,518,746 B2 | 8/2013 | Pagaila | |
| 8,822,274 B2* | 9/2014 | Suleiman | H01L 24/33 257/106 |
| 9,799,617 B1 | 10/2017 | Curiel et al. | |
| 9,870,968 B2* | 1/2018 | Spory | H01L 23/10 |
| 2001/0019176 A1 | 9/2001 | Ahiko et al. | |
| 2002/0084528 A1 | 7/2002 | Kim et al. | |
| 2002/0182782 A1 | 12/2002 | Farnworth | |
| 2003/0127423 A1 | 7/2003 | Dlugokecki | |
| 2004/0006150 A1 | 1/2004 | Murray et al. | |
| 2004/0040855 A1 | 3/2004 | Batinovich | |
| 2004/0056072 A1 | 3/2004 | Chapman et al. | |
| 2005/0057883 A1 | 3/2005 | Bolken | |
| 2005/0085578 A1 | 4/2005 | Iguchi | |
| 2005/0285250 A1 | 12/2005 | Jeong | |
| 2006/0068595 A1 | 3/2006 | Seliger et al. | |
| 2006/0166406 A1 | 7/2006 | Lin | |
| 2007/0007661 A1 | 1/2007 | Burgess | |
| 2007/0259470 A1 | 11/2007 | Quenzer et al. | |
| 2007/0295456 A1 | 12/2007 | Gudeman | |
| 2008/0124547 A1 | 5/2008 | 0 et al. | |
| 2008/0197469 A1 | 8/2008 | Yang et al. | |
| 2008/0230922 A1 | 9/2008 | Mochizuki | |
| 2009/0072413 A1 | 3/2009 | Mahler | |
| 2009/0085181 A1 | 4/2009 | Advincula, Jr. | |
| 2009/0151972 A1 | 6/2009 | Potter | |
| 2009/0160047 A1 | 6/2009 | Otsuka | |
| 2010/0007367 A1 | 1/2010 | Spielberger et al. | |
| 2010/0079035 A1 | 4/2010 | Matsuzawa et al. | |
| 2010/0140811 A1 | 6/2010 | Leal et al. | |
| 2010/0200262 A1 | 8/2010 | Mahapatra et al. | |
| 2010/0246152 A1 | 9/2010 | Lin et al. | |
| 2010/0314754 A1 | 12/2010 | Zhang | |
| 2011/0068459 A1 | 3/2011 | Pagaila et al. | |
| 2011/0215449 A1 | 9/2011 | Camacho et al. | |
| 2011/0298137 A1 | 12/2011 | Pagaila et al. | |
| 2012/0061814 A1 | 3/2012 | Camacho et al. | |
| 2012/0126384 A1* | 5/2012 | Meng | H01L 23/49503 257/670 |
| 2012/0177853 A1 | 7/2012 | Gruenwald | |
| 2012/0217643 A1 | 8/2012 | Pagaila | |
| 2012/0286412 A1* | 11/2012 | Kimura | H01L 23/3107 257/676 |
| 2013/0207248 A1 | 8/2013 | Bensoussan et al. | |
| 2014/0252584 A1* | 9/2014 | Spory | H01L 24/83 257/690 |
| 2016/0181168 A1 | 6/2016 | Spory | |
| 2016/0181171 A1 | 6/2016 | Spory | |
| 2016/0225686 A1* | 8/2016 | Spory | H01L 23/10 |
| 2016/0329305 A1 | 11/2016 | Chiao | |
| 2018/0040529 A1 | 2/2018 | Spory | |
| 2018/0047685 A1 | 2/2018 | Spory | |
| 2018/0047700 A1 | 2/2018 | Spory | |
| 2018/0053702 A1 | 2/2018 | Spory | |
| 2018/0061724 A1 | 3/2018 | Spory | |

OTHER PUBLICATIONS

Official Action for U.S. Appl. No. 14/600,691, dated Aug. 10, 2015.
Official Action for U.S. Appl. No. 14/600,691, dated Feb. 19, 2016.
Official Action for U.S. Appl. No. 14/600,691, dated Jul. 29, 2016.

(56) References Cited

OTHER PUBLICATIONS

Official Action for U.S. Appl. No. 14/600,691, dated Dec. 27, 2016.
Notice of Allowance for U.S. Appl. No. 14/600,691, dated Jun. 6, 2017.
Official Action for U.S. Appl. No. 14/600,733, dated Apr. 17, 2015.
Official Action for U.S. Appl. No. 14/600,733, dated Sep. 9, 2015.
Official Action for U.S. Appl. No. 14/600,733, dated May 9, 2016.
Official Action for U.S. Appl. No. 14/600,733, dated Aug. 23, 2016.
Official Action for U.S. Appl. No. 14/600,733, dated Dec. 2, 2016.
Notice of Allowance for U.S. Appl. No. 14/600,733, dated Oct. 5, 2017.
Official Action for U.S. Appl. No. 15/088,822, dated Mar. 24, 2017.
Notice of Allowance for U.S. Appl. No. 15/088,822, dated Aug. 15, 2017.
Official Action for U.S. Appl. No. 13/623,603, dated Jan. 16, 2018.
Notice of Allowance for U.S. Appl. No. 14/142,823, dated Nov. 30, 2017.
Notice of Allowance for U.S. Appl. No. 14/142,823, dated Feb. 16, 2018.
Notice of Allowance for U.S. Appl. No. 15/088,822, dated Nov. 13, 2017.
Getters—molecular scavengers for packaging, Dr. Ken Gilleo and Steve Corbett, HDI Jan. 2001, www.hdi-online.com, 4 pages.
Cookson Group Staydry SD1000 High Temperature Moisture Getter data sheet, Cookson Group, May 30, 2011, 1 page.
Wikipdia "Getter", retrieved May 30, 2011, http://en.wikipedia.org/wiki/Getter.
Wikipdia "Kirkendall effect", retrieved Jul. 5, 2011, http://en.wikipedia.org/wiki/Kirkendall effect.
Flip Chips dot com, Tutorial 72—Mar. 2007, Redistribution Layers, article by George A. Riley, PhD, Flipchips dot com website, downloaded Dec. 18, 2011: http://www.flipchips.com/tutorial72.html.
MIT article "Liquid Metal Printer Lays Electronic Circuits on Paper, Plastic, and even Cotton", downloaded from MIT Technology Review Nov. 22, 2013, http://www.technologyreview.com/view/521871/liquid-metal-printer-lays-electronic-circuits-on-paper-plastic-and-even-cotton/.
sPRO 125 and sPRO 250 Direct Metal SLM Production Printer datasheet, 3DSystems, Part No. 70743, Issue Date Apr. 10 2012.
Wikipedia "3D Printing" reference, downloaded Jan. 12, 2015.
Wikipedia "Screen printing" reference, downloaded Jan. 12, 2015.
Wikipedia "Ball Bonding", downloaded Apr. 11, 2016.
Solid State Technology "The back-end process: Step 7—Solder bumping step by step", by Deborah S. Patterson, http://electroiq.com/blog/2001/07/the-back-end-process-step-7-solder-bumping-step-by-step/, downloaded Apr. 11, 2016.
Official Action for U.S. Appl. No. 13/623,603, dated Dec. 9, 2014.
Official Action for U.S. Appl. No. 13/623,603, dated Apr. 16, 2015.
Official Action for U.S. Appl. No. 13/623,603, dated Aug. 14, 2015.
Official Action for U.S. Appl. No. 13/623,603, dated Apr. 29, 2016.
Official Action for U.S. Appl. No. 13/623,603, dated Aug. 24, 2016.
Official Action for U.S. Appl. No. 623,603, dated Apr. 11, 2017.
Official Action for U.S. Appl. No. 13/785,959, dated Jan. 5, 2015.
Official Action for U.S. Appl. No. 13/785,959, dated Apr. 16, 2015.
Official Action for U.S. Appl. No. 14/142,823, dated Jan. 5, 2015.
Official Action for U.S. Appl. No. 14/142,823, dated May 11, 2015.
Official Action for U.S. Appl. No. 14/142,823, dated Oct. 9, 2015.
Official Action for U.S. Appl. No. 14/142,823, dated Feb. 29, 2016.
Official Action for U.S. Appl. No. 14/142,823, dated Jul. 28, 2016.
Official Action for U.S. Appl. No. 14/142,823, dated Mar. 17, 2017.
Official Action for U.S. Appl. No. 15/792,414, dated Mar. 19, 2018.
Notice of Allowance for U.S. Appl. No. 15/792,414, dated May 14, 2018.
Official Action for U.S. Appl. No. 15/792,225, dated Apr. 30, 2018.
Official Action for U.S. Appl. No. 15/792,312, dated Apr. 19, 2018.
Notice of Allowance for U.S. Appl. No. 15/792,225, dated Sep. 24, 2018.
Official Action for U.S. Appl. No. 15/661,060, dated Aug. 27, 2018.
Notice of Allowance for U.S. Appl. No. 15/792,312, dated Sep. 18, 2018.

* cited by examiner

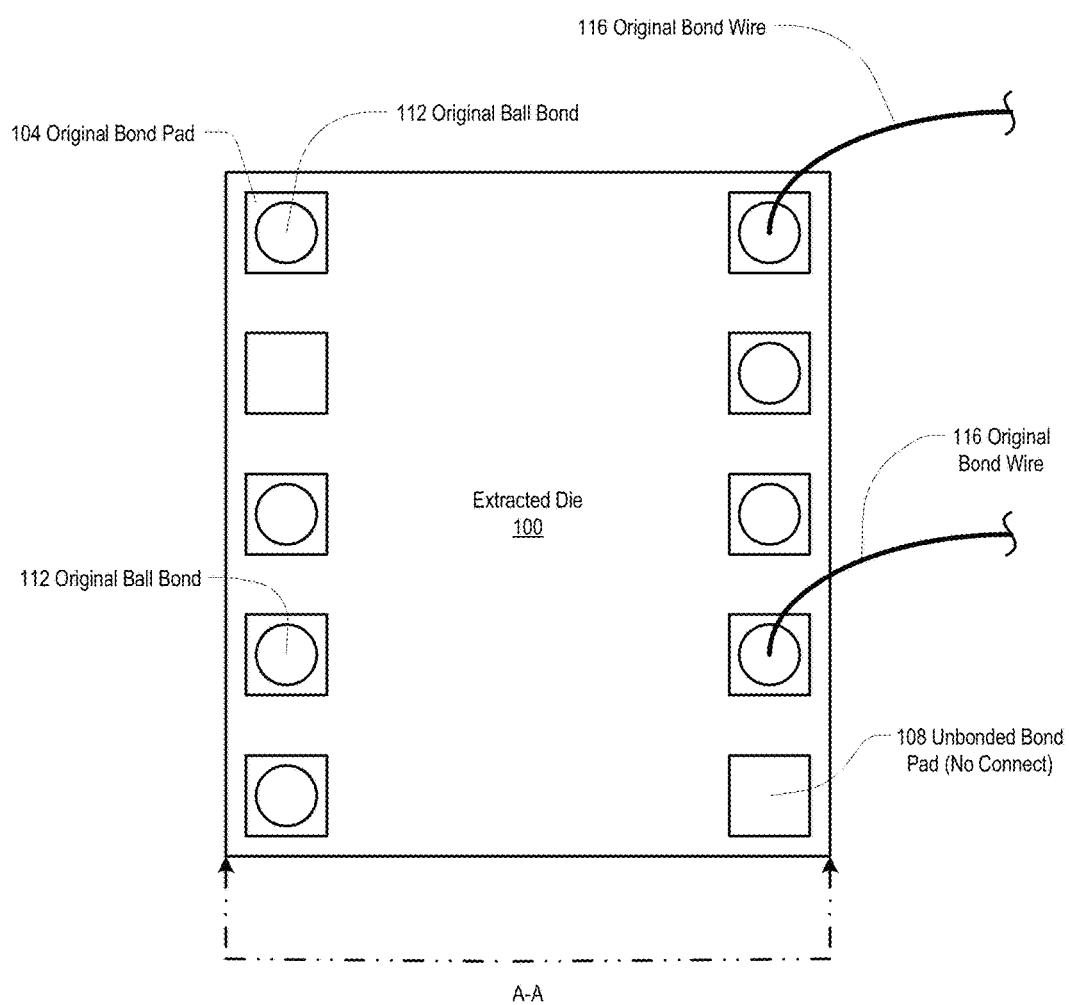
Fig. 1 Extracted Die With Original Bond Pads, Original Ball Bonds, and Original Bond Wires Fig. 2A Extracted Die Section A-A
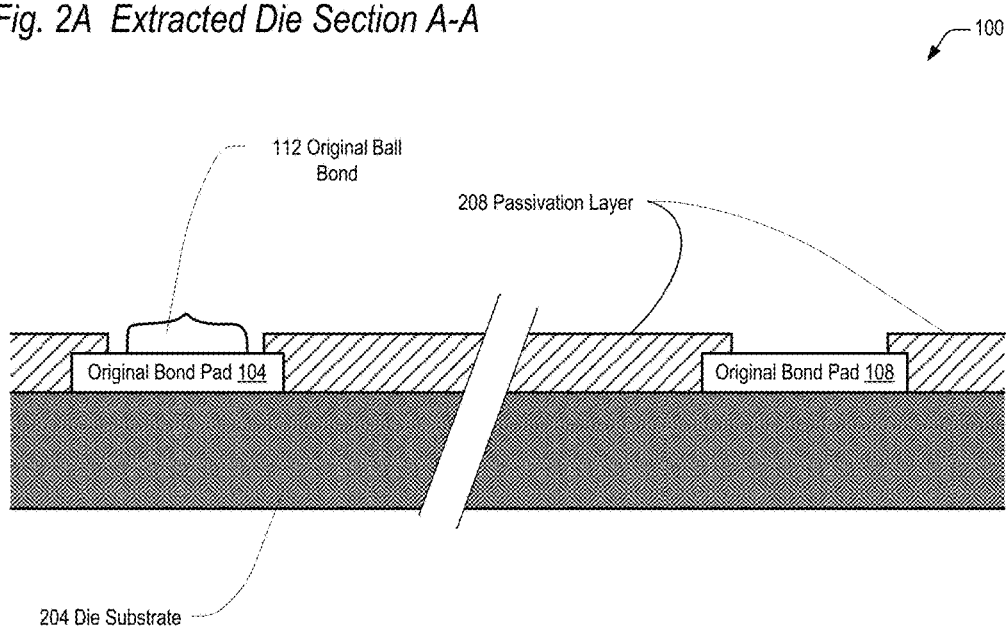
Fig. 2B Modified Extracted Die Section A-A After Original Ball Bond and Original Bond Wire Removal
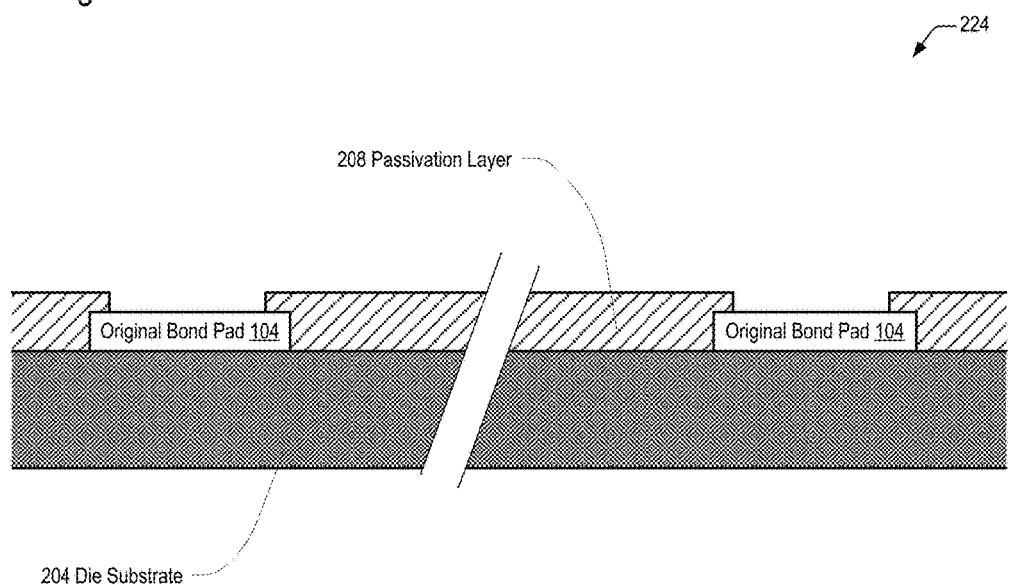

Fig. 2C  Extracted Die Section A-A After 3D Printing Bond Conductor Only
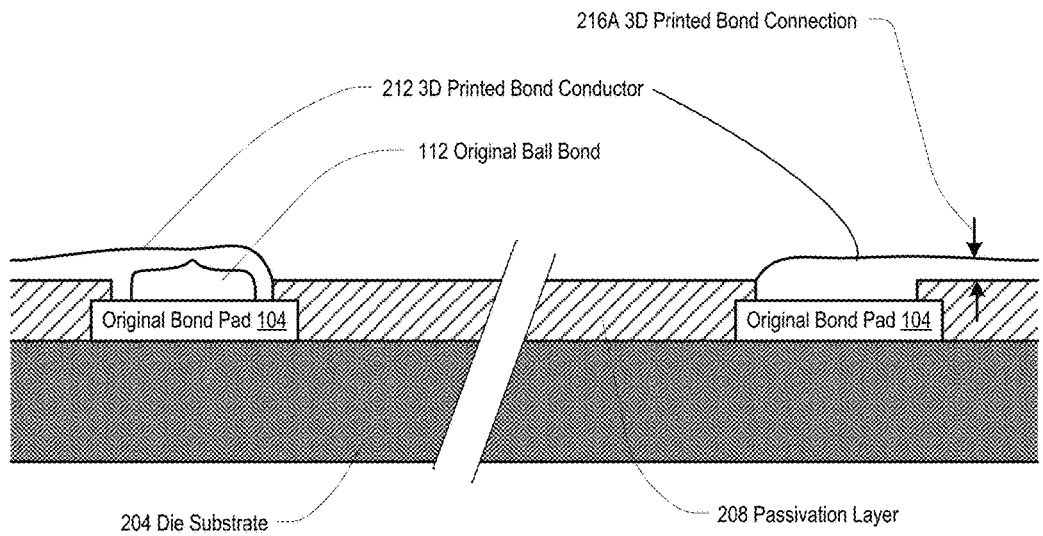
Fig. 2D  Extracted Die Section A-A After 3D Printing Bond Insulator Before 3D Printing Bond Conductor
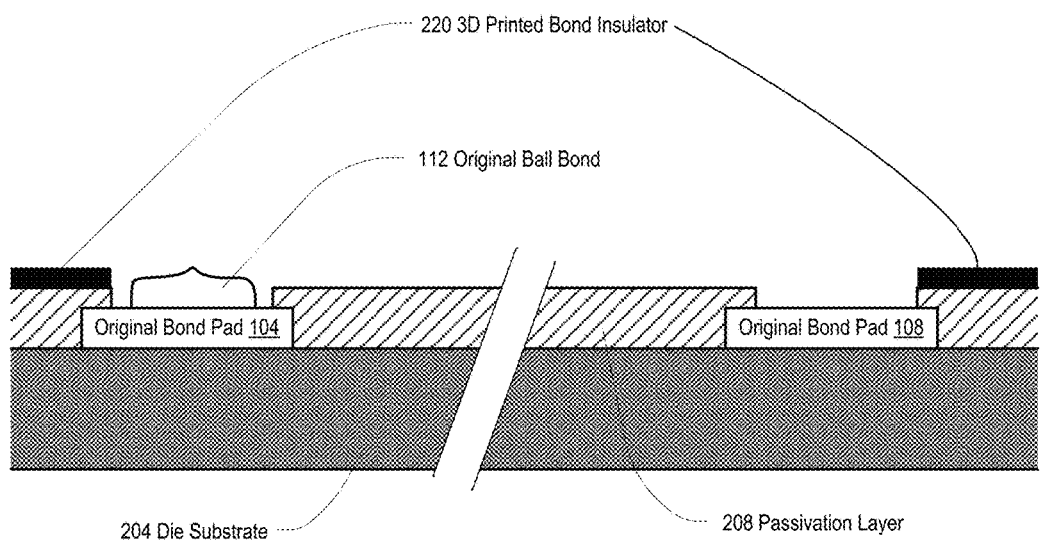

Fig. 2E  Extracted Die Section A-A After 3D Printing Insulator and Conductor
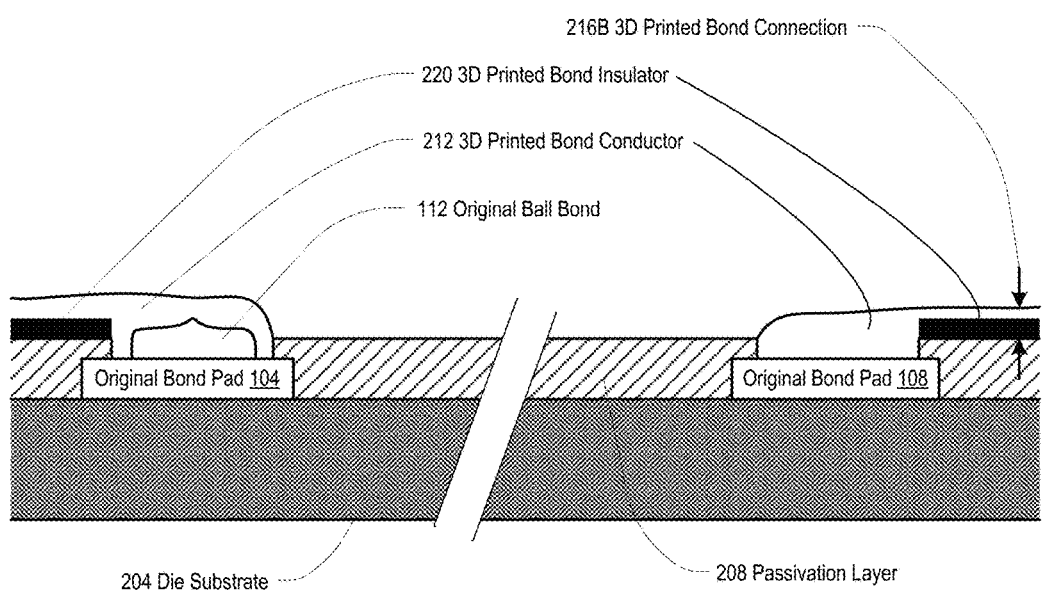

*Fig. 3A Mounted Remapped Extracted Die*
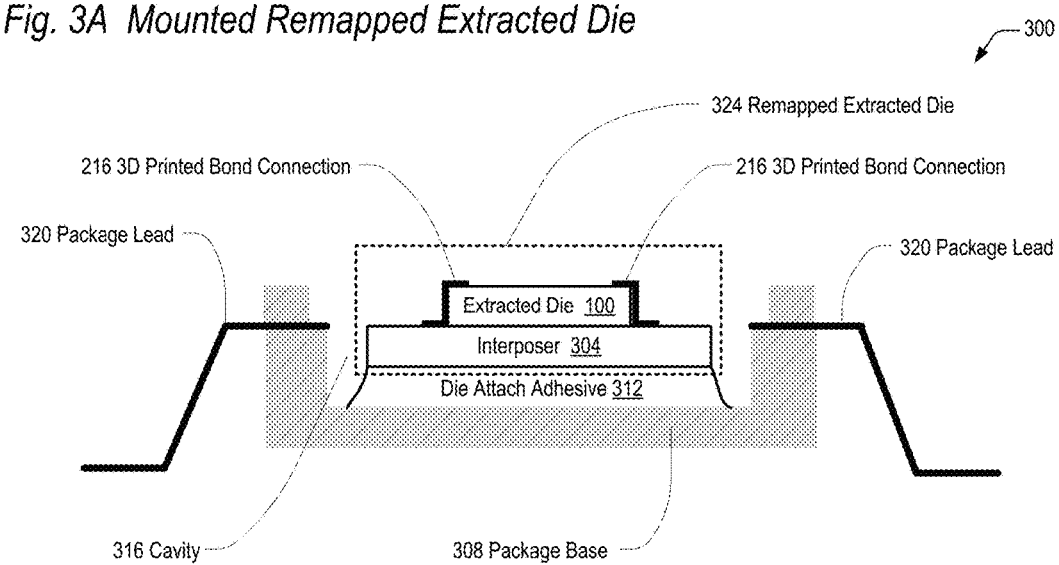
*Fig. 3B Assembled Package Base With New 3D Printed Bond Connections*
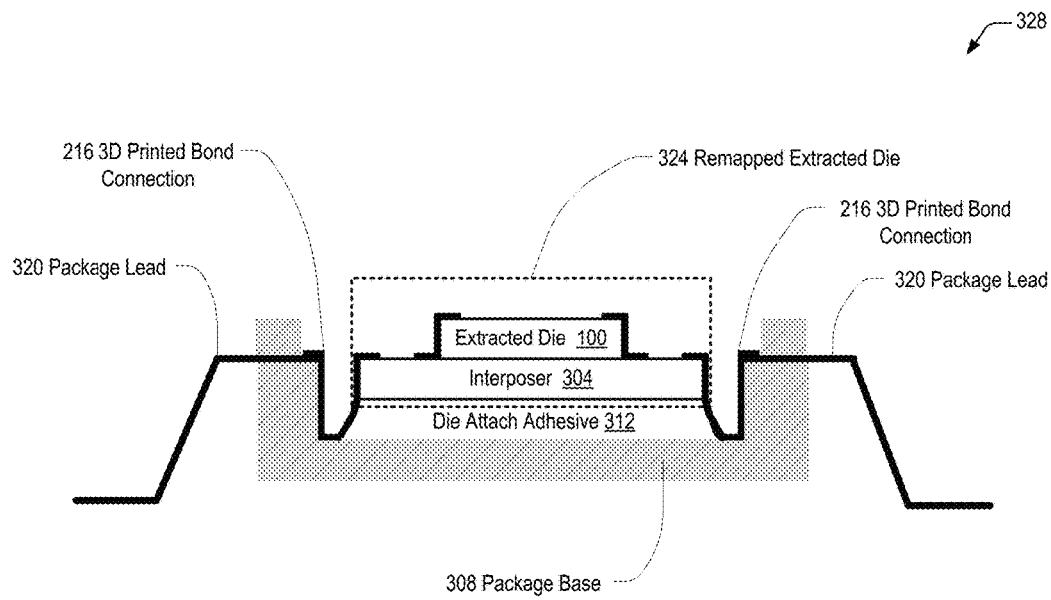

*Fig. 3C Mounted Remapped Extracted Die*
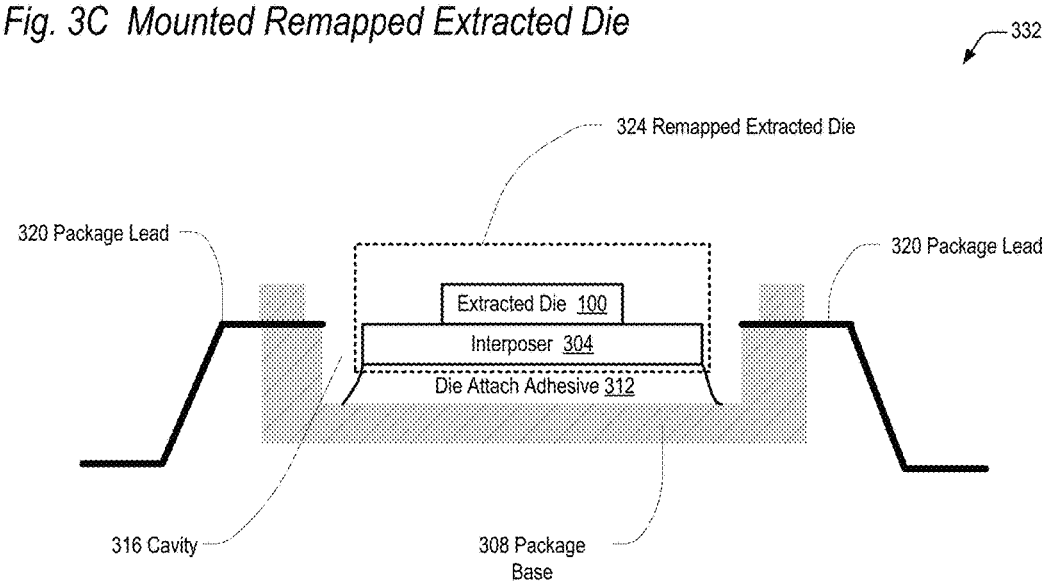
*Fig. 3D Assembled Package Base With New 3D Printed Bond Connections*
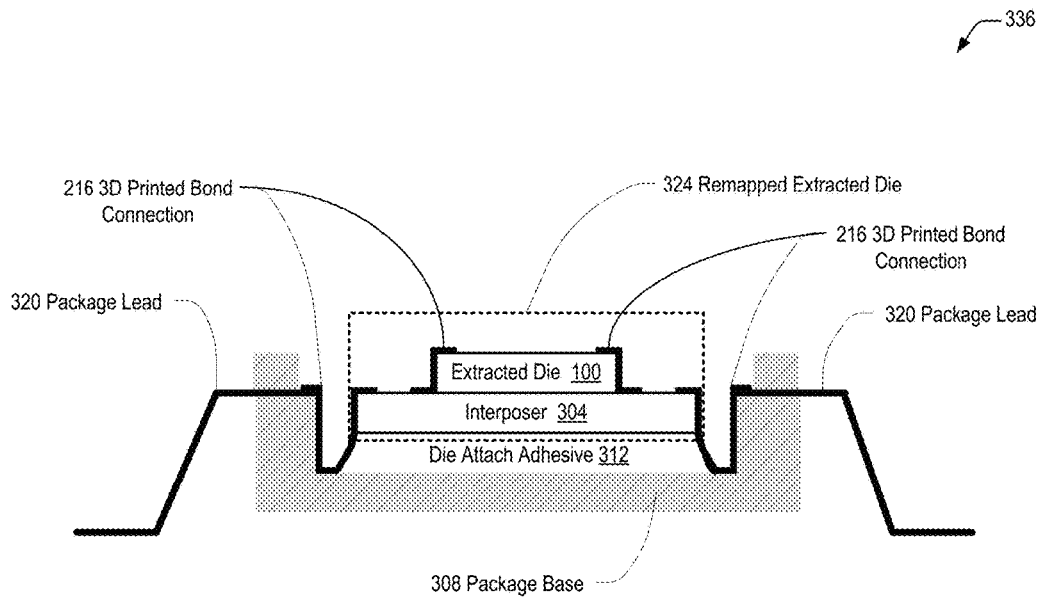

Fig. 3E Assembled Package With Remapped Extracted Die
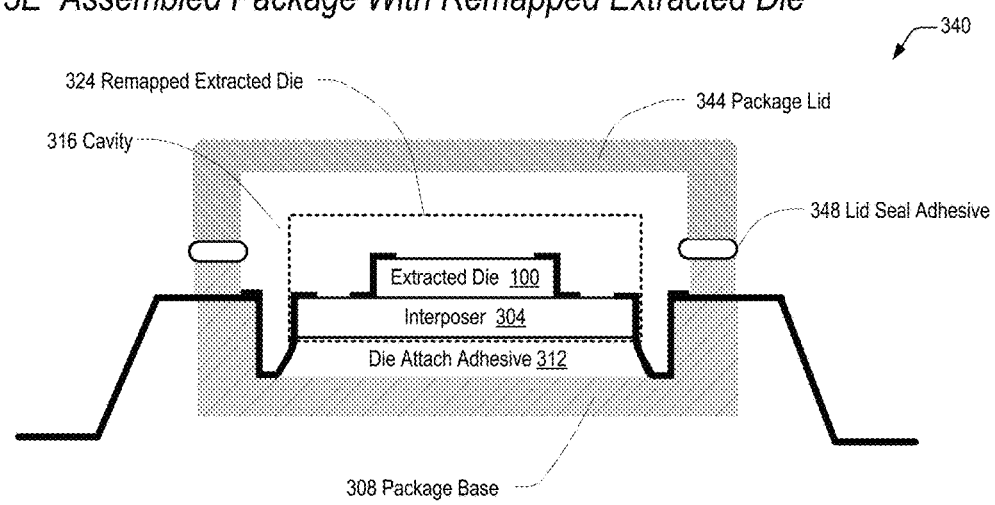
Fig. 3F Assembled Hermetic Package With Remapped Extracted Die
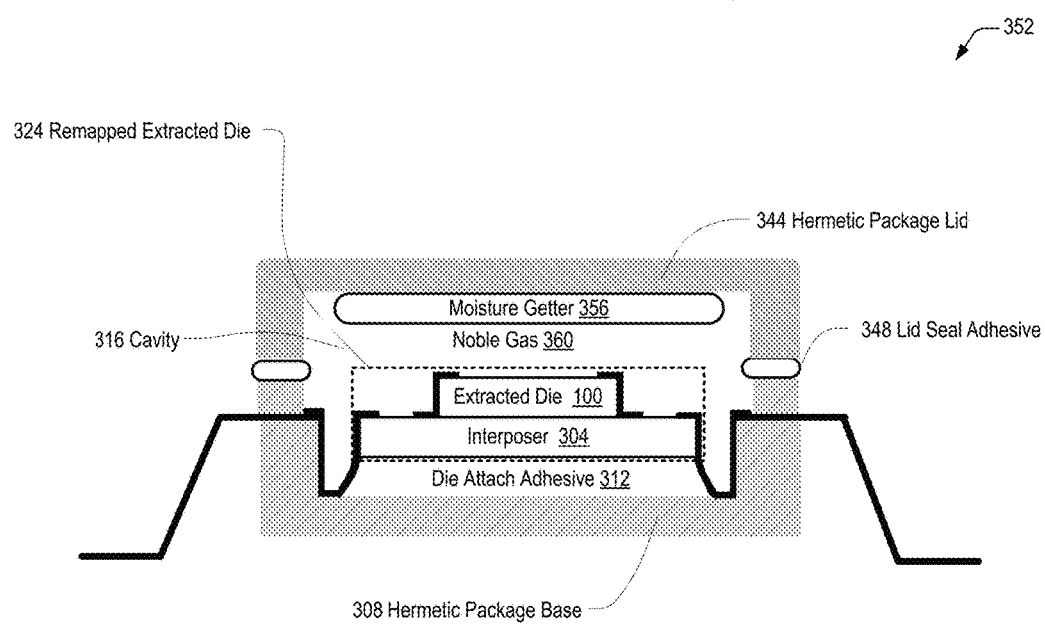

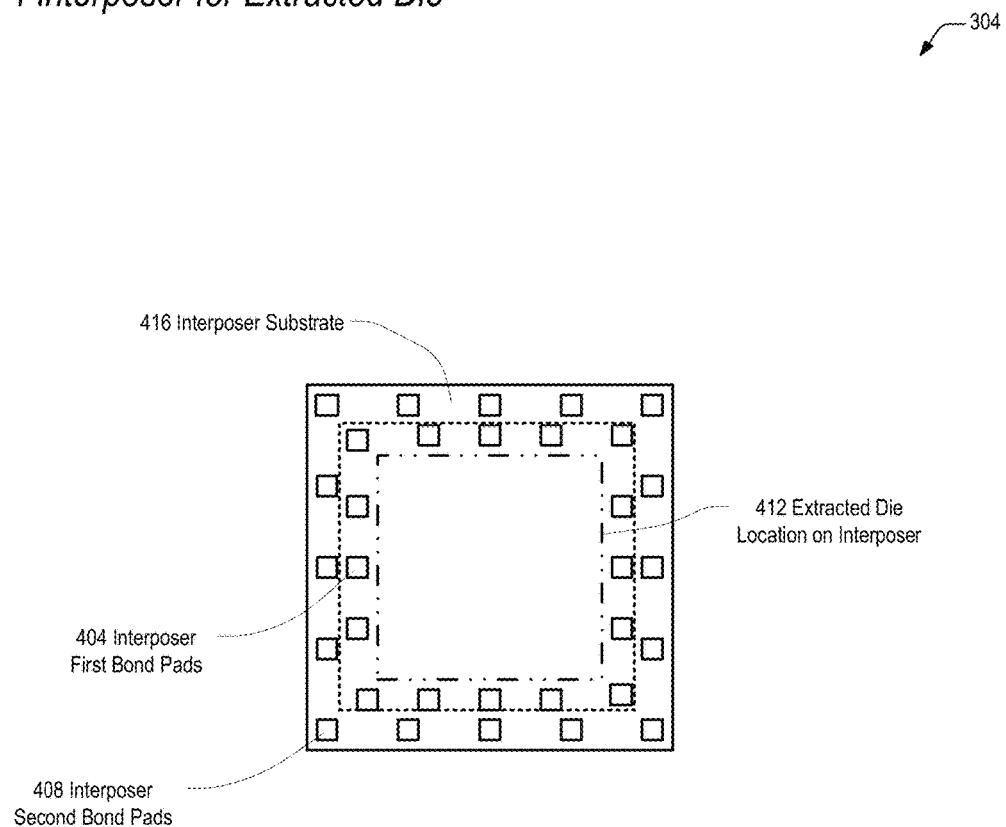
Fig. 4 Interposer for Extracted Die

Fig. 5A Top View of New Package Base Before 3D Printing Bond Connections
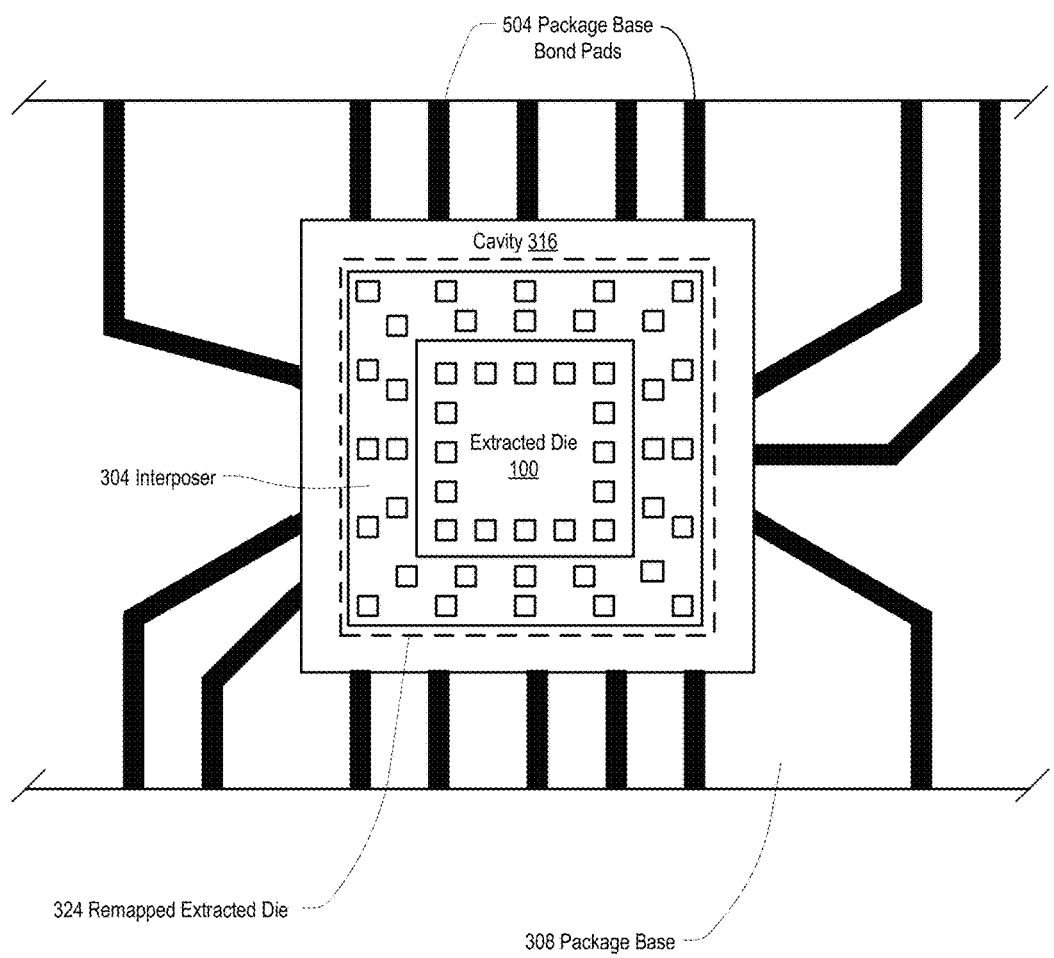

Fig. 5B Top View of New Package Base After 3D Printing Bond Connections
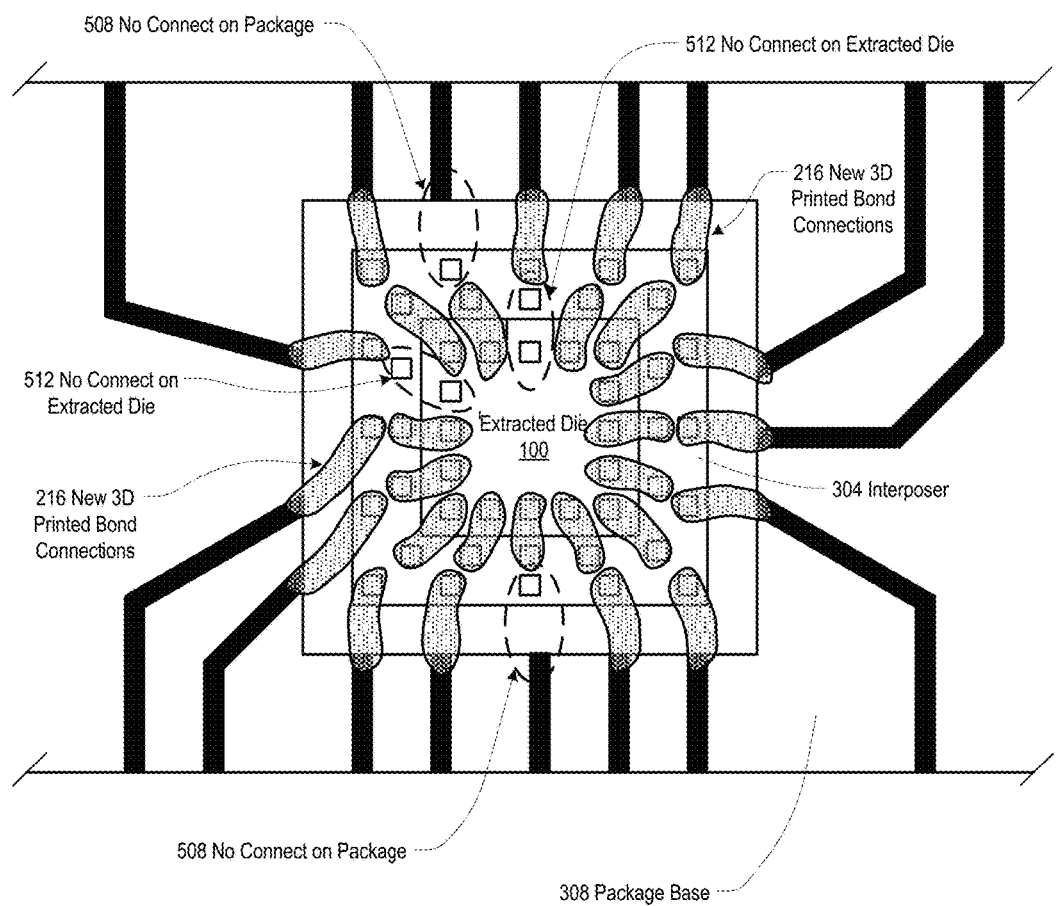

Fig. 5C Top View of New Package Base After 3D Printing Crossed Connections
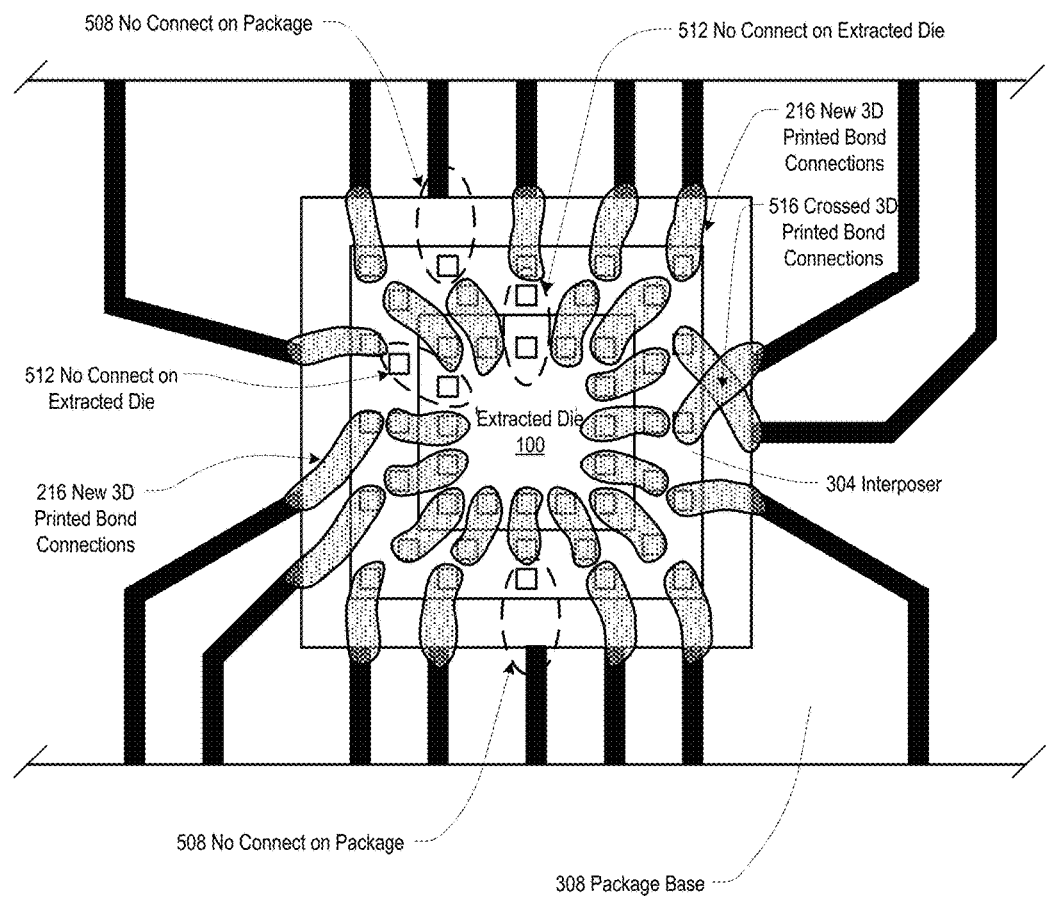

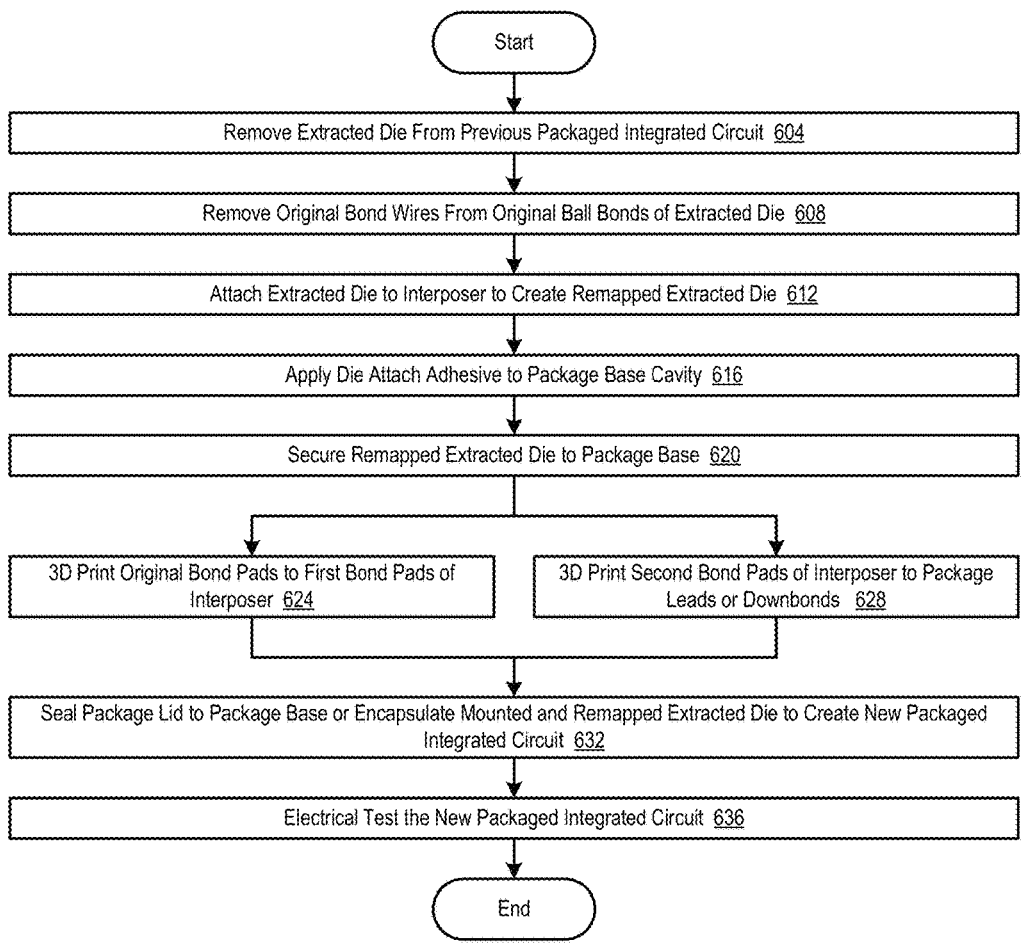
Fig. 6A Assembly Method for New Packaged Integrated Circuit

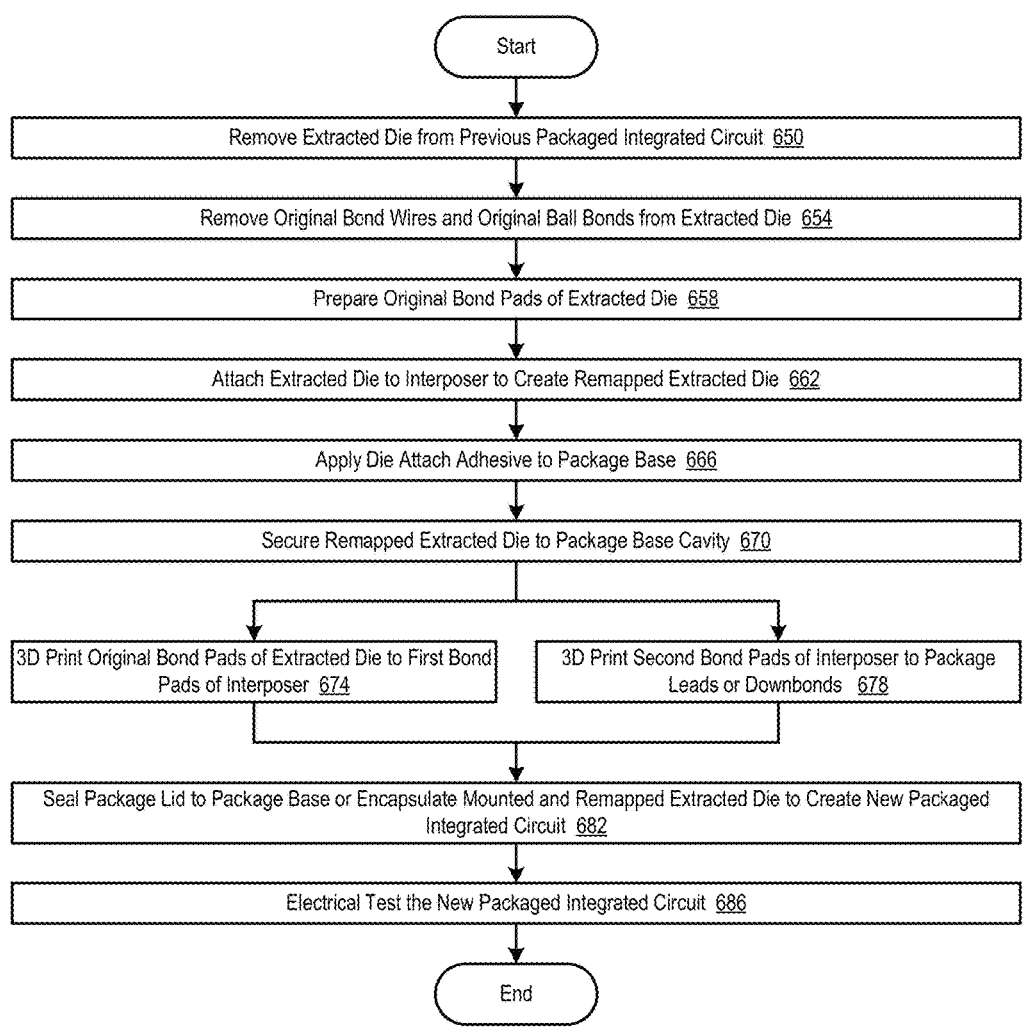
*Fig. 6B Assembly Method for New Packaged Integrated Circuit*

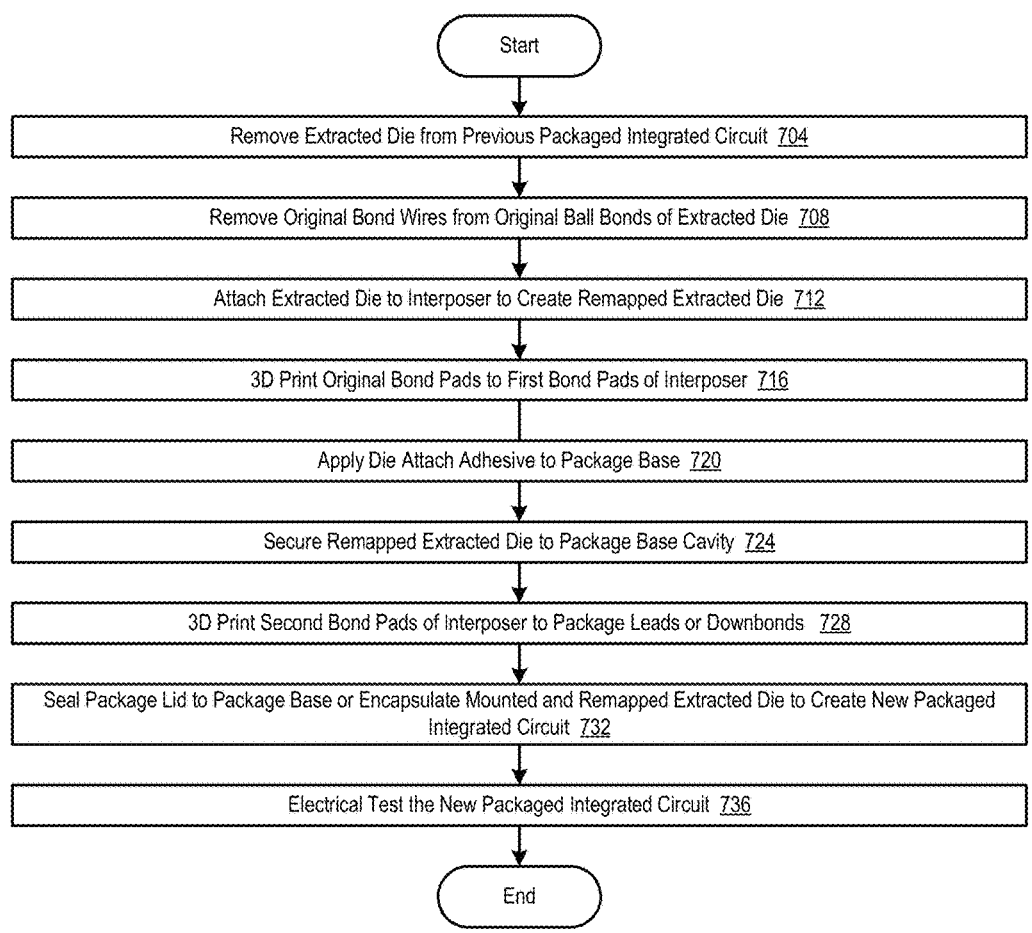
Fig. 7A Assembly Method for New Packaged Integrated Circuit

*Fig. 7B Assembly Method for New Packaged Integrated Circuit*
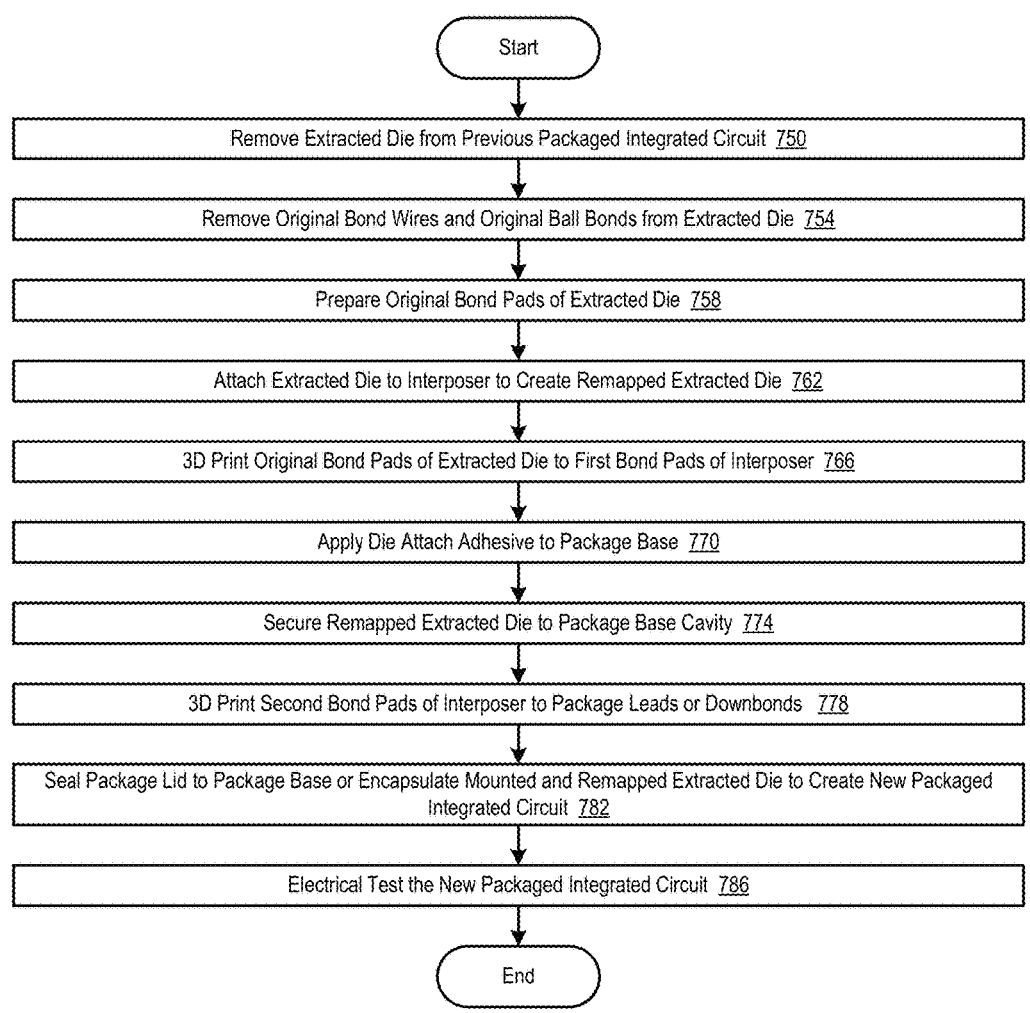

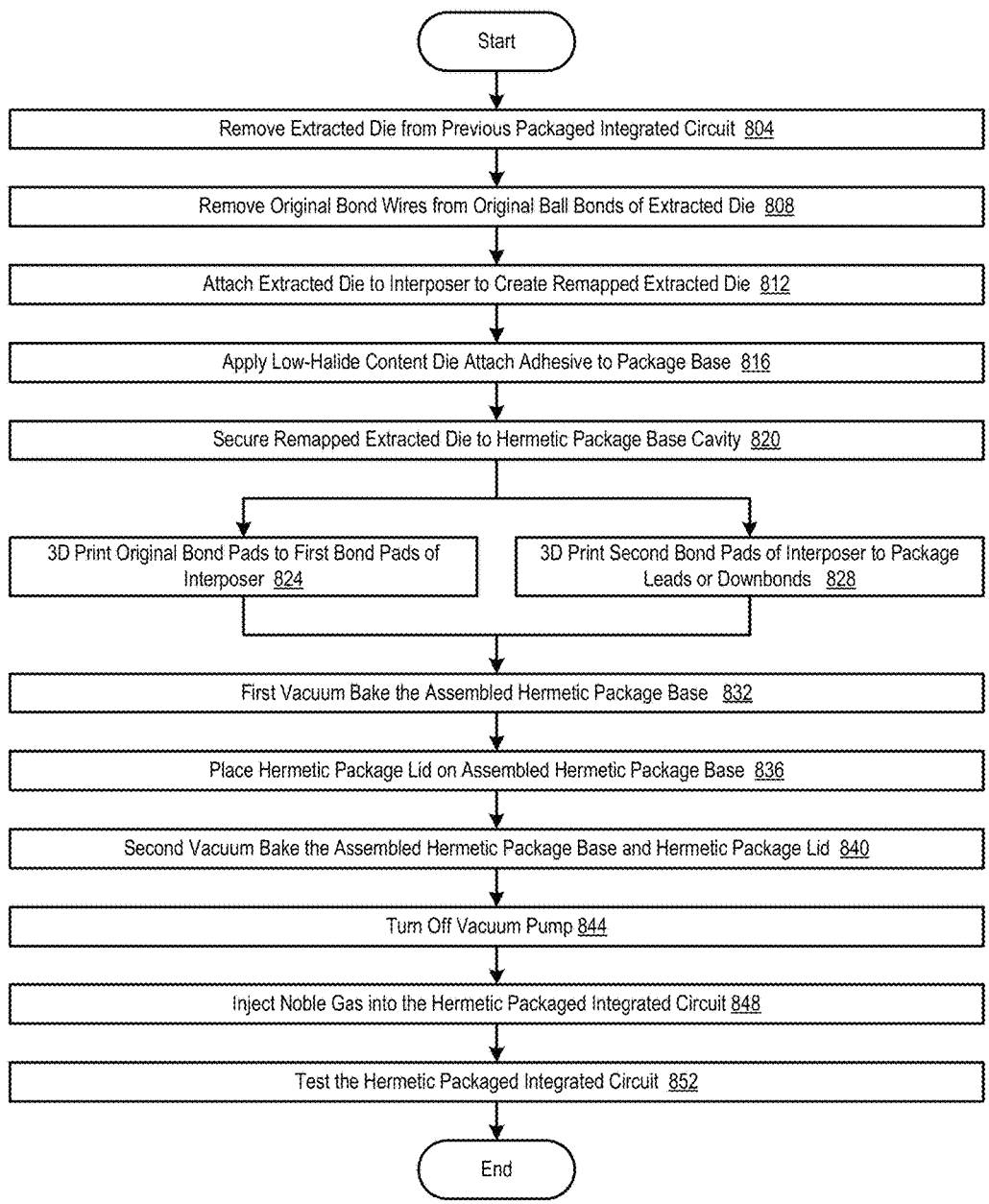
Fig. 8A  Assembly Method for Hermetic Packaged Integrated Circuit

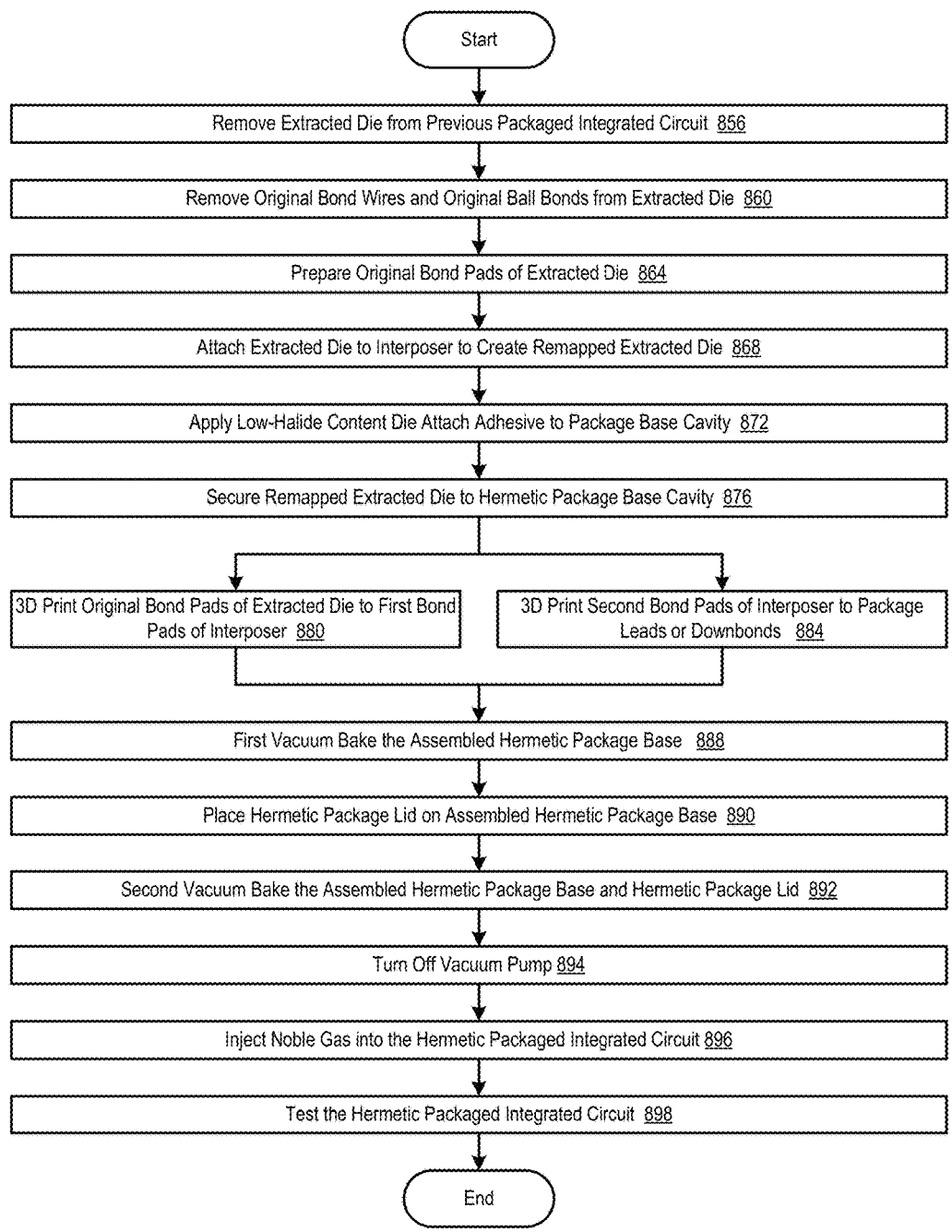
Fig. 8B Assembly Method for Hermetic Packaged Integrated Circuit

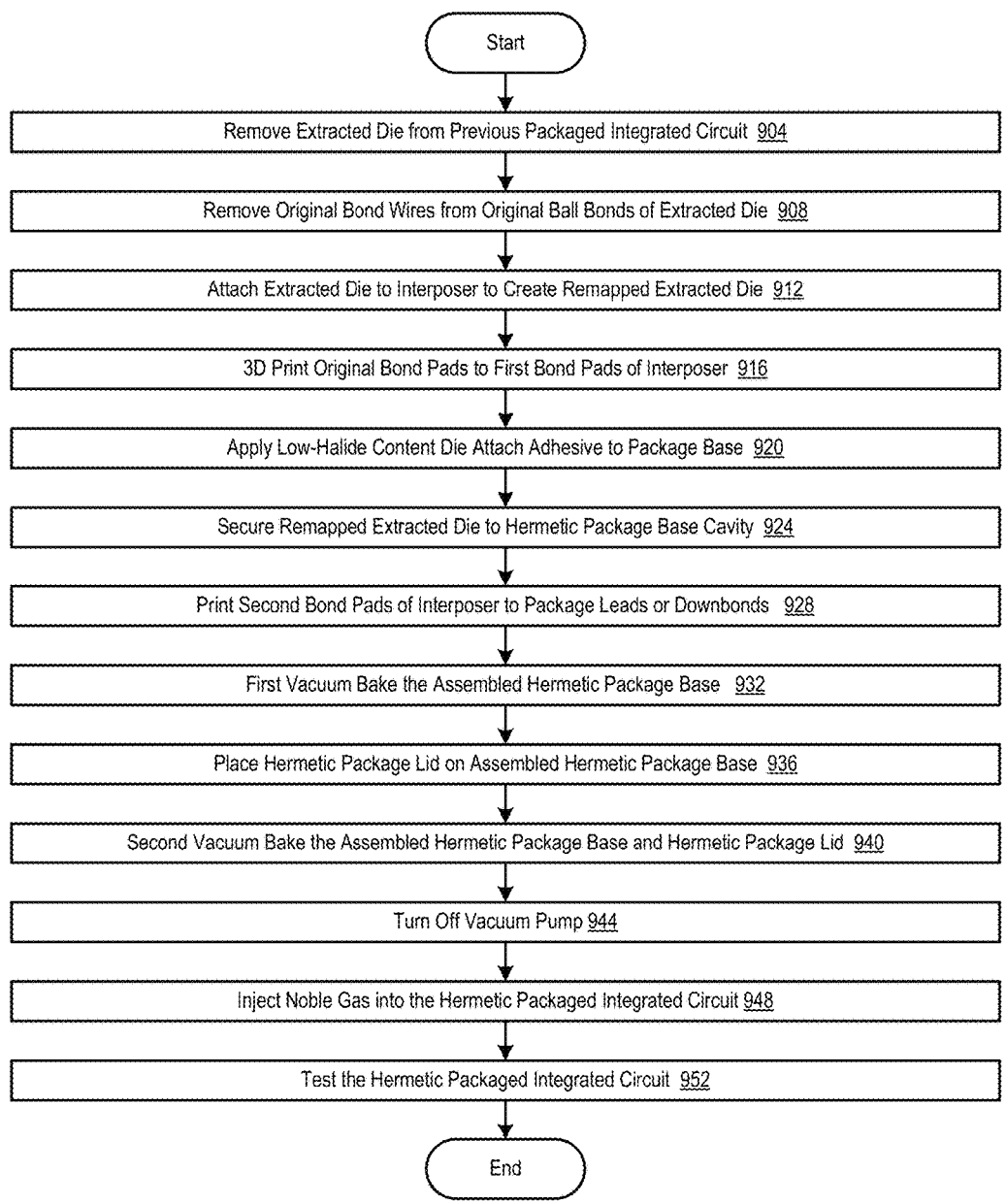
Fig. 9A  Assembly Method for Hermetic Packaged Integrated Circuit

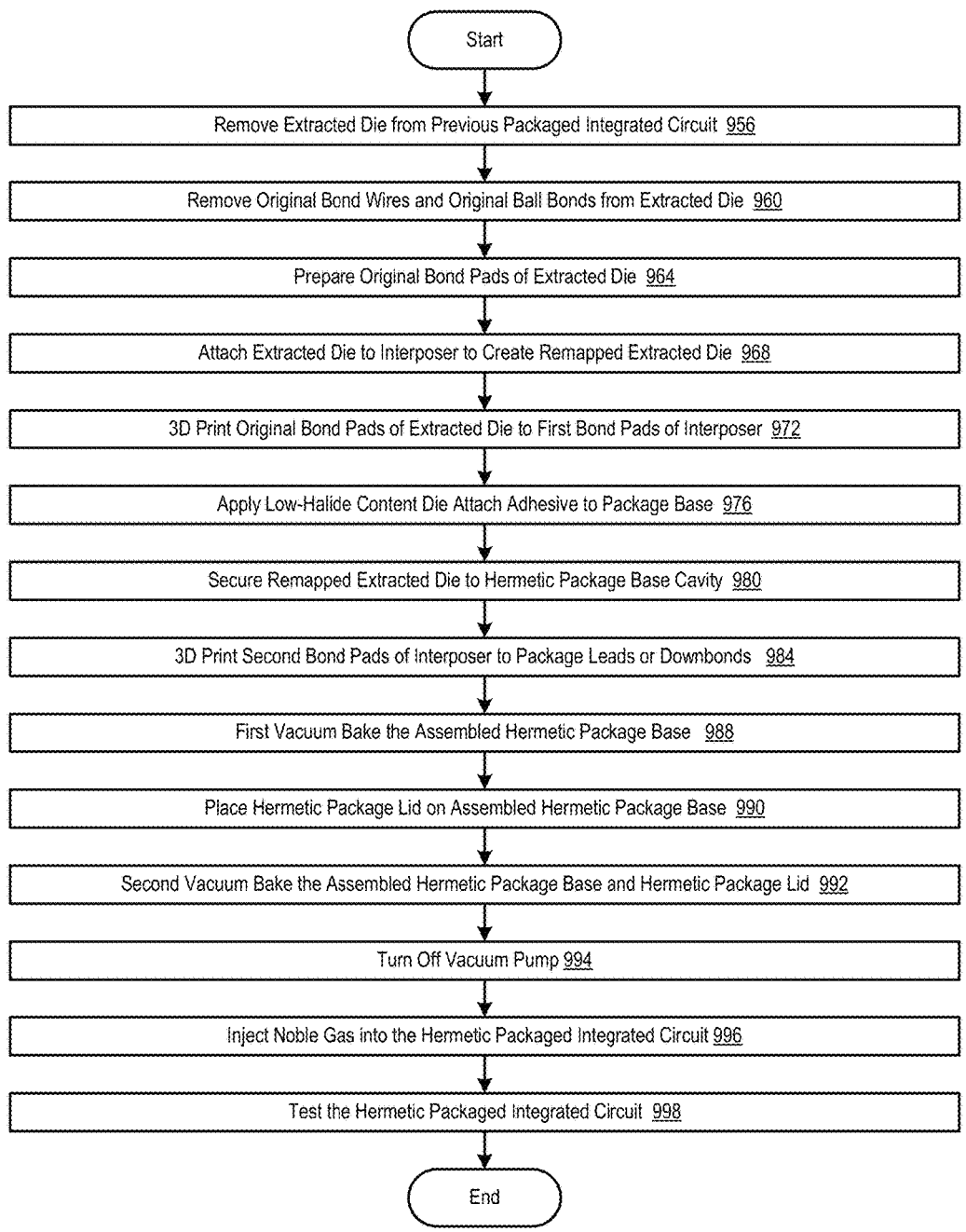
Fig. 9B Assembly Method for Hermetic Packaged Integrated Circuit

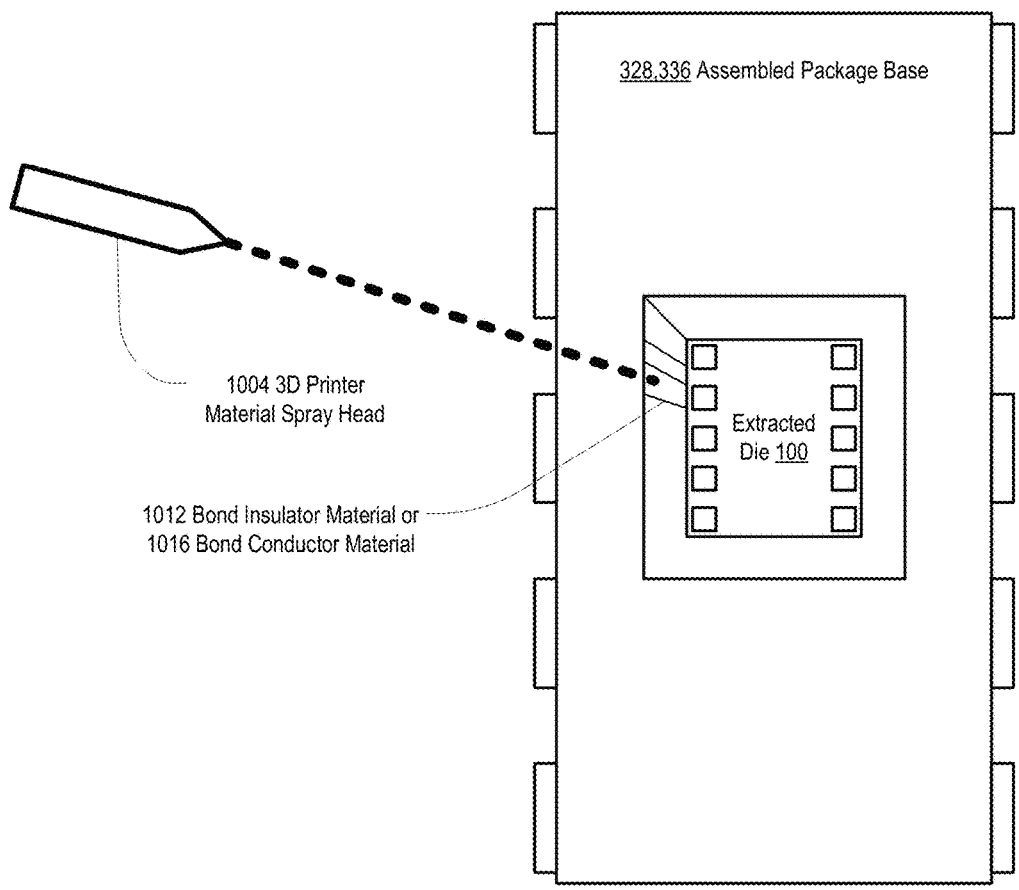
Fig. 10  Insulating and Conducting Material Spray with 3D Printer

Fig. 11 Sintering Process to Form Printed Bond Insulator or Printed Bond Conductor
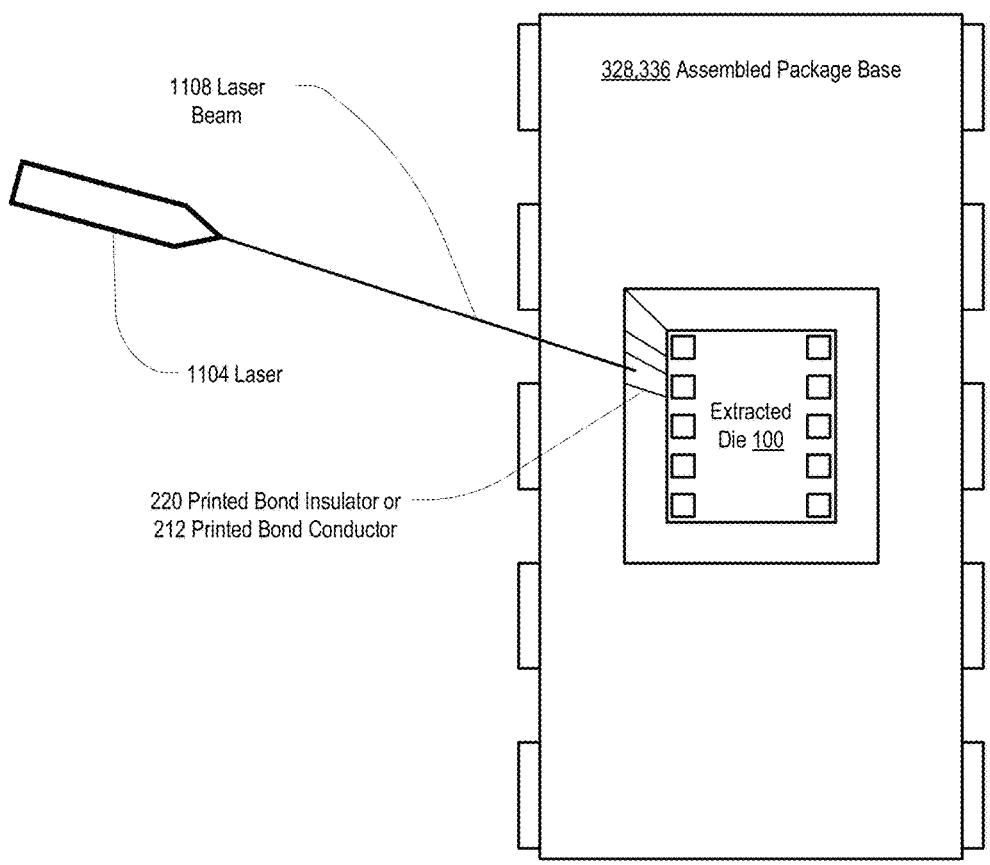

REMAPPED PACKAGED EXTRACTED DIE WITH 3D PRINTED BOND CONNECTIONS

CROSS REFERENCE TO RELATED APPLICATIONS

This application is a Continuation-in-Part of pending U.S. application Ser. No. 14/600,733, filed Jan. 20, 2015, entitled INTEGRATED CIRCUIT WITH PRINTED BOND CONNECTIONS, which is hereby incorporated by reference for all purposes, which is a Divisional of U.S. application Ser. No. 14/142,823, filed Dec. 28, 2013, entitled METHOD AND APPARATUS FOR PRINTING INTEGRATED CIRCUIT BOND CONNECTIONS, which is a Continuation-in-Part of U.S. application Ser. No. 13/785,959 filed Mar. 5, 2013, entitled ENVIRONMENTAL HARDENED INTEGRATED CIRCUIT METHOD AND APPARATUS, which is a Continuation-in-Part of U.S. application Ser. No. 13/623,603 filed Sep. 20, 2012, entitled ENVIRONMENTAL HARDENING TO EXTEND OPERATING LIFETIMES OF INTEGRATED CIRCUITS AT ELEVATED TEMPERATURES, which is a Continuation of U.S. application Ser. No. 13/283,293 filed Oct. 27, 2011, entitled ENVIRONMENTAL HARDENING TO EXTEND OPERATING LIFETIMES OF INTEGRATED CIRCUITS AT ELEVATED TEMPERATURES, now abandoned.

FIELD

The present invention is directed to integrated circuit packaging. In particular, the present invention is directed to remapped extracted dice in new packaged integrated circuits.

BACKGROUND

Integrated circuits are available in many different packages, technologies, and sizes. Most integrated circuits are available in plastic packages, which are generally intended for commercial operating environments at a low cost. Commercial operating environments have a specified operating range from 0° C. to 70° C. Integrated circuits for military applications have historically been packaged in either metal or ceramic hermetic packages, which are able to work reliably in more demanding environments than commercial integrated circuits. Military operating environments have a specified operating range from −55° C. to 125° C. In order to save costs, the military has purchased integrated circuits through COTS (Commercial Off-The-Shelf) programs. However, these components are generally commercial grade components in plastic packages, and not intended for demanding environments requiring the broader temperature range reliability and durability of ceramic and metal hermetically packaged integrated circuits.

Depending on size and complexity, integrated circuits are available in a wide range of packages. Although many older integrated circuits were packaged using through-hole technology packages, surface mount packages have dominated over the past several decades. Surface mount packages generally have circuit density, cost, and other advantages over through-hole integrated circuits. Examples of through-hole packages include DIP (dual-in-line plastic) and PGA (pin grid array). Examples of surface mount packages include SOIC (small-outline integrated circuit) and PLCC (plastic leaded chip carrier).

Integrated circuit packages generally consist of a semiconductor die placed within a package base and bonded to the base with a suitable die attach adhesive. In conventional technology, the die is electrically attached to a lead frame of the package base with discrete bond wires, which connect individual pads of the die with package leads. In most cases, the bond wires are gold, but in other environments can be copper or aluminum. Specialized equipment is required to attach the bond wires to the die pads the lead frame. Once all of the bond wires are attached, the package lid is bonded to the package base and the integrated circuit can be tested.

SUMMARY

In accordance with embodiments of the present invention, an integrated circuit is provided. The integrated circuit includes a package base including package leads, an extracted die removed from a previous packaged integrated circuit, and an interposer bonded to the extracted die and the package base. The extracted die includes original bond pads and one or more original ball bonds on the original bond pads. The interposer includes first bond pads electrically connected to the original bond pads with 3D printed first bond connections conforming to the shapes and surfaces of the extracted die and the interposer and second bond pads electrically connected to the package leads with 3D printed second bond connections conforming to shapes and surfaces of the interposer and package base.

In accordance with another embodiment of the present invention, an integrated circuit is provided. The integrated circuit includes a package base including package leads, a reconditioned die including a modified extracted die with reconditioned bond pads, the modified extracted die including an extracted die with no ball bonds on original bond pads of the extracted die, the extracted die including a fully functional semiconductor die with one or more ball bonds on one or more original bond pads, the reconditioned bond pads comprising layers of nickel, palladium, and gold over the original bond pads. The integrated circuit also includes an interposer bonded to the reconditioned die and the package base. The interposer includes first bond pads electrically connected to the reconditioned bond pads with 3D printed first bond connections conforming to the shapes and surfaces of the reconditioned die and the interposer and second bond pads electrically connected to the package leads or downbonds with 3D printed second bond connections conforming to shapes and surfaces of the interposer and package base.

In accordance with further embodiments of the present invention, an integrated circuit is provided. The integrated circuit includes a package base including package leads, a modified extracted die removed from a previous packaged integrated circuit, and an interposer bonded to the extracted die and the package base. The modified extracted die includes an extracted die with original bond pads and no original ball bonds or bond wires on the original bond pads, while the extracted die has been removed from a previous packaged integrated circuit and includes one or more original ball bonds on the original bond pads. The interposer includes first bond pads electrically connected to the original bond pads with first 3D printed bond conductors conforming to the shapes and surfaces of the modified extracted die and the interposer, and second bond pads electrically connected to the package leads with second 3D printed bond conductors conforming to shapes and surfaces of the interposer and package base.

An advantage of the present invention is that it allows a packaged integrated circuit to be produced even if the die or wafers needed are out of production. Sometimes, the only way to obtain new packaged integrated circuits is to reuse extracted dice from previous packaged integrated circuits.

Another advantage of the present invention is it provides a way to repackage an extracted die for a different package and pinout than the extracted die was originally packaged for. There is no limit to the pinouts that may be thusly created, and by using different interposers, extracted dice may be utilized in many different packages and pinouts.

Yet another advantage of the present invention is it allows a generic interposer to be used for various pinouts required in various new packages. Differences in package pinout is easily accommodated by 3D printing crossed bond connections, with a 3D printed insulating layer between crossed 3D printed bond conductors.

Additional features and advantages of embodiments of the present invention will become more readily apparent from the following description, particularly when taken together with the accompanying drawings.

BRIEF DESCRIPTION OF THE DRAWINGS

FIG. 1 is a diagram illustrating an extracted die with original bond pads, original ball bonds, and original bond wires in accordance with embodiments of the present invention.

FIG. 2A is an illustration depicting a section A-A of an extracted die in accordance with embodiments of the present invention.

FIG. 2B is an illustration depicting a section A-A of a Modified extracted die after original ball bond and original bond wire removal in accordance with embodiments of the present invention.

FIG. 2C is an illustration depicting a section A-A of an extracted die after 3D printing only bond conductors in accordance with embodiments of the present invention.

FIG. 2D is an illustration depicting a section A-A of an extracted die after 3D printing bond insulators before 3D printing bond conductors in accordance with embodiments of the present invention.

FIG. 2E is an illustration depicting a section A-A of an extracted die after 3D printing insulators and conductors in accordance with embodiments of the present invention.

FIG. 3A is an illustration depicting a mounted remapped extracted die in accordance with embodiments of the present invention.

FIG. 3B is an illustration depicting an assembled package base with new 3D printed bond connections in accordance with embodiments of the present invention.

FIG. 3C is an illustration depicting a mounted remapped extracted die in accordance with embodiments of the present invention.

FIG. 3D is an illustration depicting an assembled package base with new 3D printed bond connections in accordance with embodiments of the present invention.

FIG. 3E is an illustration depicting an assembled package with a remapped extracted die in accordance with embodiments of the present invention.

FIG. 3F is an illustration depicting an assembled hermetic package with a remapped extracted die in accordance with embodiments of the present invention.

FIG. 4 is an illustration depicting an interposer for an extracted die in accordance with embodiments of the present invention.

FIG. 5A is an illustration depicting a top view of a new package base before 3D printing bond connections in accordance with embodiments of the present invention.

FIG. 5B is an illustration depicting a top view of a new package base after 3D printing bond connections in accordance with embodiments of the present invention.

FIG. 5C is an illustration depicting a top view of a new package base after 3D printing some crossed connections in accordance with embodiments of the present invention.

FIG. 6A is a flowchart illustrating an assembly method for a new packaged integrated circuit in accordance with a first embodiment of the present invention.

FIG. 6B is a flowchart illustrating an assembly method for a packaged integrated circuit in accordance with a second embodiment of the present invention.

FIG. 7A is a flowchart illustrating an assembly method for a new packaged integrated circuit in accordance with a third embodiment of the present invention.

FIG. 7B is a flowchart illustrating an assembly method for a packaged integrated circuit in accordance with a fourth embodiment of the present invention.

FIG. 8A is a flowchart illustrating an assembly method for a hermetic packaged integrated circuit in accordance with a first hermetic embodiment of the present invention.

FIG. 8B is a flowchart illustrating an assembly method for a hermetic packaged integrated circuit in accordance with a second hermetic embodiment of the present invention.

FIG. 9A is a flowchart illustrating an assembly method for a hermetic packaged integrated circuit in accordance with a third hermetic embodiment of the present invention.

FIG. 9B is a flowchart illustrating an assembly method for a hermetic packaged integrated circuit in accordance with a fourth hermetic embodiment of the present invention.

FIG. 10 is an illustration depicting insulating and conducting material spray with a 3D printer in accordance with the present invention.

FIG. 11 is an illustration depicting a sintering process to form a 3D printed bond insulator or a 3D printed bond conductor in accordance with embodiments of the present invention.

DETAILED DESCRIPTION

Integrated circuits are most commonly packaged in plastic packages using dice with Aluminum (Al) bond pads and Gold (Au) bond wires from the bond pads to the package leads and package cavity. Bond wires are attached to bond pads and package leads using thermosonic bonding, wedge bonding, or other processes well understood in the art.

In some cases, bare dice and wafers are generally not available. It is therefore highly desirable to obtain dice from previously packaged integrated circuits. Integrated circuit dice are then extracted from an existing package—usually plastic—and repackaged into a suitable package according to the component needs of the market. These extracted dice retain the original Au ball bonds on the Al bond pads. In some cases, extracted dice are repackaged into commercial plastic packages. In other cases, often military or environmentally hardened applications, extracted dice are repackaged into hermetic ceramic or metal packages.

The present invention is directed to integrated circuits and methods for removing extracted dice from a previous package and repackaging into a different package, often with a different pinout from the previous package.

Referring now to FIG. 1, an extracted die 100 with original bond pads 104, 108, original ball bonds 112, and original bond wires 116 in accordance with embodiments of the present invention is shown. Each previously used original bond pad 104 of the extracted die 100 may have an original ball bond 112 present, although one or more unbonded bond pads 108 may not have an original ball bond 112 present. In some cases, this is due to a no-connect in the previous package. When the extracted die 100 was present in whatever previous integrated circuit package was used for the extracted die 100, original bond wires 116 connected each of the original ball bonds 112 to a lead or a downbond of the previous integrated circuit package.

FIG. 1 illustrates the extracted die 100, after it has been removed from the previous integrated circuit package. Therefore, some original bond wires 116 have been removed and some original bond wires 116 remain. In current technology packaged integrated circuits, the vast majority of bond wire interconnections are made with Au thermosonic ball bonding. Section A-A is used in FIGS. 2A-2E to illustrate a side view of extracted die 100.

Referring now to FIG. 2A, an illustration depicting a section A-A of an extracted die 100 in accordance with embodiments of the present invention is shown. extracted die 100 includes a die substrate 204 supporting a passivation layer 208 and original bond pads 104, 108. Extracted die 100 includes one or more original bond pads 104, which include an original ball bond 112. Extracted die 100 may also include one or more original bond pads 108, which do not include an original ball bond 112. It is likely that original bond pads 108 were a no connect bond pad in the previous integrated circuit package.

Referring now to FIG. 2B, a diagram illustrating a section A-A of a modified extracted die 224 after original ball bond 112 and original bond wire 116 removal in accordance with embodiments of the present invention is shown. A modified extracted die 224 is an extracted die 100 with the original ball bonds 108 and original bond wires 116 removed. Although in some embodiments original gold ball bonds 112 may be removed by mechanical means, in most cases it is preferable to use chemical removal means by known processes. FIG. 2B illustrates the original ball bond 112 and original bond wire 116 removed from the original bond pad 104. Not shown in FIG. 2B is that after removing the original ball bond 112 and original bond wire 116, some amount of intermetallic residue and/or oxides will be present on the original bond pads 104. This generally requires removal to make sure there are no impurities, residues, or oxides on the original bond pads 104, 108. Removal is preferably performed using a mild acid wash. The acid wash is followed by an acid rinse that removes surface oxides present on the original bond pads 104, 108. For plating on an Aluminum surface, a Zincate process is used to etch away a very fine layer of Aluminum from the original bond pads 104, 108 and redeposit a layer of Zinc (Zn) on the original bond pads 104, 108. The fine layer of Zinc will then act as a catalyst for the Nickel plating to follow. Once residues and oxides have been removed from the original bond pads 104, 108, in some embodiments the surface of the original bond pads 104, 108 is rendered to an increased degree of flatness by applying a lapping process. This has the added benefit of providing a uniformly smooth and consistent bond pad 104, 108 surface in preparation for following reconditioning/metallization (ENEPIG, for example) or ball bonding operations.

Once in a clean d flat state, the original bond pads 104, 108 are considered bare original bond pads 104, 108 and are ready to be reconditioned. Reconditioning of the present invention is a process whereby the original bond pads 104, 108 are cleaned as described above and built up by successive and ordered application of specific metallic layers prior to new wire bonding or 3D printing processes. Following the ordered application of specific metallic layers (Nickel, followed by Palladium, followed by Gold, for example), the die is a reconditioned die.

In one embodiment, after an extracted die 100 is removed from a packaged integrated circuit, only original bond wires 116 are removed—thus leaving original ball bonds 112 on less than all original bond pads 104 of the extracted die 100. Original ball bonds 112 must be removed prior to reconditioning original bond pads 104. Therefore, in some embodiments the metallic layers of the present invention are provided not to empty original bond pads 108, but rather original bond pads 104 following original ball bond 112 removal, or to any original bond pad 104, 108 intended to receive a 3D printed bond connection 216.

Referring now to FIG. 2C, an illustration depicting a section A-A of an extracted die 100 after 3D printing a bond conductor 212 only in accordance with embodiments of the present invention is shown. 3D printed bond conductors 212 provide similar electrical conduction properties as conventional bond wires, and are able to adhere to exposed surfaces of the extracted die 100, any other substrates, and interior surfaces of integrated circuit packages. In some embodiments, 3D printed bond connections 216 include only 3D printed bond conductors 212.

For embodiments where there is no electrical shorting concern with surfaces of the extracted die 100 and other substrates, the 3D printed bond conductor 212 may be 3D printed directly to those surfaces. Bond conductors 212 are 3D printed in successive layers to build up a preferred thickness of material to resist cracking and still allow electrical conduction even if moderately scratched. Printed bond conductor 212 thickness can be less than 2 microns and is preferably 0.5-1 microns. Printed bond conductors 212 substantially cover original bond pads 108, and both original ball bonds 112 and original bond pads 104 where a reconditioning process has not been used.

Referring now to FIG. 2D, an illustration depicting a section A-A of an extracted die 100 after 3D printing bond insulators 220 prior to 3D printing bond conductors 212 in accordance with embodiments of the present invention is shown. For embodiments where there is an electrical shorting concern with surfaces of the extracted die 100 and other substrates, the bond insulator 220 may be 3D printed directly to those surfaces. Bond insulators 220 are 3D printed in successive layers to build up a preferred thickness of material to resist cracking and still allow electrical conduction even if moderately scratched. Printed bond insulator 220 thickness can be less than 2 microns and is preferably 0.5-1 microns. Bond insulators 220 substantially cover electrically conductive areas of the extracted die 100, substrates, and package base where a 3D printed bond conductors 212 will later be applied. It is therefore important to apply 3D printed bond insulators 220 in such a way that edges of 3D printed bond conductors 212 have no possibility of making contact with undesired conductive surfaces. This may be avoided by spraying 3D bond insulators 220 with a greater width than 3D printed bond conductors 212 to provide an insulating margin at the edge of each 3D printed bond insulator/bond conductor 220, 212.

Referring now to FIG. 2E, an illustration depicting a section A-A of an extracted die 100 after 3D printing bond conductors 212 and bond insulators 220 in accordance with embodiments of the present invention is shown. 3D printed bond insulators 220 cover at least conductive portions of the extracted die 100, substrates including Interposers 304, and interior surfaces of the package. 3D bond conductors 212 are 3D printed over the bond insulators 220, and provide the same electrical interconnection function as original bond wires 116. In this embodiment, the 3D printed bond connections 216 include the 3D printed bond conductors 212 and 3D printed bond insulators 220.

Referring now to FIG. 3A, an illustration depicting a mounted remapped extracted die 300 in accordance with embodiments of the present invention is shown. The mounted remapped extracted die 300 is an intermediate assembly step for a new assembled integrated circuit. The assembled package base includes a package base 308 or new package base 308. In one embodiment, the package base 308 is a non-hermetic package base 308. In another embodiment, the package base 308 is a hermetic package base 308. In non-hermetic applications, package base 308 is generally plastic. If the package base 308 is a hermetic package base 308, it may be formed from ceramic, metal, or glass materials.

After preparing or reconditioning any original bond pads 104, 108 of the extracted die 100, the extracted die 100 is bonded to an interposer 304 with a die attach adhesive 312 or other suitable adhesive compound. The extracted die 100, modified extracted die 224, or reconditioned die bonded to the interposer 304 is referred to herein as a remapped extracted die 324. In one embodiment, the original bond pads 104, 108 are prepared by removing original bond wires 116 and leaving original ball bonds 112 on the original bond pads 104. In other embodiments, the original bond pads 104, 108 are prepared by removing original ball bonds 112 and original bond wires 116, and removing any traces of original ball bonds 112, chemical residues, and other deposits from the original bond pads 104 (modified extracted die 224). In some embodiments, the original bond pads 104, 108 are lapped, buffed, or polished before adding 3D printed bond insulators 220 or 3D printed bond conductors 212. In some embodiments, Nickel Palladium, and Gold layers are added to the original bond pads 104, 108 as detailed in related application Ser. No. 15/088,822 following ball bond/bond wire removal, oxide/residue removal, and/or lapping, buffing, or polishing before adding 3D printed bond insulators 220 or 3D printed bond conductors 212 (reconditioned die).

The package base 308 includes a cavity 316 into which the remapped extracted die 324 is placed. Die attach adhesive 312 is applied to the package base 308 such that when the extracted die 100 is inserted into the cavity 316, the die attach adhesive 312 makes simultaneous contact with both the package base 308 and the extracted die 100. In embodiments where the package base 308 is a component of a hermetic package, die attach adhesive 312 is a low-halide compound die attach adhesive, where a low halide compound has less than 10 parts per million (ppm) halides. Die attach adhesive 312 therefore bonds the extracted die 100 to the package base 308, and protects the integrity of the interior of the mounted remapped extracted die 300. It has been well established that halogens in an Au—Al bond interface degrade Au—Al bond strength since out-gassed products from adhesives containing halogens rapidly corrode Al metallization in integrated circuits at high temperatures, thus reducing product lifetime at high temperatures.

Associated with the package base 308 are a series of package leads 320, which provide interconnection between circuitry of the extracted die 100 and circuitry of a printed circuit board on which the packaged integrated circuit is eventually mounted. For example, if an S0-24 ceramic package is used for the packaged integrated circuit, 24 package leads 320 would be present, configured as 12 package leads 320 on each of two opposite sides of the package base 308. If a PLCC-68 ceramic package is used for the integrated circuit, 68 package leads 320 would be present, configured as 17 package leads 320 on each of the four sides of the package base 308. The present invention may be used for any type of previous integrated circuit package or any type of new hermetic or non-hermetic integrated circuit package.

After mounting the remapped extracted die 324 into the package base 308 using die attach adhesive 312, 3D printed bond connections 216 may then attached as described herein. Alternatively, 3D printed bond connections 216 may be provided between the extracted die 100 and the interposer 304 on the remapped extracted die 324 prior to securing the remapped extracted die 324 to the package base 308 with die attach adhesive 312.

Referring now to FIG. 3B, an illustration depicting an assembled package base 328 with new 3D printed bond connections 216 in accordance with embodiments of the present invention is shown. After the remapped extracted die 324 is secured to the package base 308 using a die attach adhesive 312, 3D printed bond connections 216 are applied between bond pads of the Interposer 304 and Package leads 320 or downbonds. 3D printed bond connections 216 between original bond pads 104, 108 of the extracted die 100 and first bond pads 404 of the interposer were applied prior to the step shown in FIG. 3B, when the remapped extracted die 324 was not secured to the package base 308. Thus, FIG. 3B reflects an assembly process where the previous step is as shown in FIG. 3A.

In a first embodiment, 3D printed bond insulators 220 are provided over at least electrically conductive areas of the interposer 304 and the package base 308. After the 3D printed bond insulators 220 have been applied, in a secondary operation 3D printed bond conductors 212 are provided over the 3D printed bond insulators 220 and/or non-electrically conductive portions of the interposer 304 and the package base 308. In a second embodiment, only 3D printed bond conductors 212 are provided over non-electrically conductive portions of the interposer 304 and the package base 308.

Referring now to FIG. 3C, an illustration depicting a mounted remapped extracted die 332 in accordance with embodiments of the present invention is shown. The mounted remapped extracted die 332 is an intermediate assembly step for a new assembled integrated circuit, and serves as an assembled package base. The assembled package base includes a package base 308 or new package base 308. In one embodiment, the package base 308 is a non-hermetic package base 308. In another embodiment, the package base 308 is a hermetic package base 308. In non-hermetic applications, package base 308 is generally plastic. If the package base 308 is a hermetic package base 308, it may be formed from ceramic, metal, or glass materials.

The mounted remapped extracted die 332 is similar to the mounted remapped extracted die 300 of FIG. 3A, but lacks 3D printed bond connections 216 between the extracted die 100 and the interposer 304. This means that all 3D printing of bond connections 216 is performed at the stage of the assembled package base, rather than 3D printed bond connections 216 of the remapped extracted die 324 applied prior to securing the remapped extracted die 324 to the package base 308. One advantage of this is that only a single fixture is required to position the package base 308 for 3D printing operations, rather than one fixture of the remapped extracted die 324 and a separate fixture for the package base 308.

Referring now to FIG. 3D, an illustration depicting an assembled package base 328 with new 3D printed bond connections 216 in accordance with embodiments of the present invention is shown. The assembled package base shown in FIG. 3D has the same components as the assembled package base shown in FIG. 3B. However, in FIG. 3D all 3D printed bond connections 216 are applied, rather than only the 3D printed bond connections 216 between the interposer 304 and the package leads 320 or downbonds. Thus, FIG. 3D reflects an assembly process where the previous step is as shown in FIG. 3C.

In a first embodiment, 3D printed bond insulators 220 are provided over at least electrically conductive areas of the extracted die 100, interposer 304, and the package base 308. After the 3D printed bond insulators 220 have been applied, in a secondary operation 3D printed bond conductors 212 are provided over the 3D printed bond insulators 220 and/or non-electrically conductive portions of the extracted die 100, interposer 304, and the package base 308. In a second embodiment, only 3D printed bond conductors 212 are provided over non-electrically conductive portions of the extracted die 100, interposer 304, and the package base 308.

Referring now to FIG. 3E, an illustration depicting an assembled package 340 with a remapped extracted die 324 in accordance with embodiments of the present invention is shown. Packaged integrated circuit 340 is assembled package base 328 or 336 with a package lid 344 or new package lid 344 attached. Where the package base 308 and package lid 344 are non-plastic materials, lid seal adhesive 348 is generally required. In non-hermetic applications, package lid 344 is generally plastic and is molded to a plastic package base 308 with an encapsulation process. In such cases, a lid seal adhesive 348 may not be required. Thus, FIG. 3E reflects an assembly process where the previous step is as shown in either FIG. 3B or 3D.

Referring now to FIG. 3F, an illustration depicting an assembled hermetic package 352 with a remapped extracted die 324 in accordance with embodiments of the present invention is shown. Assembled hermetic package 352 includes an assembled hermetic package base 328, 336 of FIGS. 3B and 3D and additional components described below.

For a hermetic integrated circuit package 352 including a hermetic package base 308, once all new 3D printed bond connections 216 are applied between package leads 320 and downbonds and the remapped extracted die 324, the assembled package base 328, 336 including remapped extracted die 324, die attach adhesive 312, package base 308, package leads 320, and new 3D printed bond connections 216, is first and second vacuum baked according to the processes of parent application Ser. No. 13/623,603.

In addition to a low-halide die attach adhesive 312, the assembled hermetic package 352 may also optionally include moisture getter 356 and/or a Noble gas 360 within the cavity 316 at the time the hermetic package lid 344 is secured to the hermetic package base 308 using a lid seal adhesive 348.

Referring now to FIG. 4, an illustration depicting an interposer 304 for an extracted die 100 in accordance with embodiments of the present invention is shown. Interposer 304 includes a substrate 416 that the extracted die 100 is mounted on one side of, and translates original bond pad 104, 108 locations into bond pad locations that match a desired pinout/pin assignments of packaged integrated circuits 340, 352. Interposer 304 is a substrate or other material such as FR-4, Capton, Teflon, or Polyamide suitable for mounting within a package base 308 and carrying electrical signals to and from the extracted die 100 and package leads 320 or downbonds.

Interposer 304 includes a location 412 for mounting the extracted die 100 on a specified side of interposer 304. Extracted die 100 may be secured to interposer 304 with die attach adhesive 312, an epoxy, or other chemical and/or mechanical means known in the art. In most embodiments, extracted die 100 is mounted centrally on the interposer 304 in order to facilitate 3D printing the bond connections 216. However, in some embodiments the extracted die 100 may not be centrally mounted on interposer 304 for various reasons.

Interposer 304 includes first bond pads 404 generally oriented around the periphery of the extracted die Location 412. The first bond pads 404 provide new 3D printed bond conductor 212 attachment points between original bond pads 104, 108 of the extracted die 100 and the interposer 304.

In general, each of the first bond pads 404 is electrically connected to a second bond pad 408 through rerouting circuitry within the interposer 304. However, it is not a requirement that every such pad 404, 408 be thusly connected. The second bond pads 408 are generally oriented around the periphery of the interposer 304. The second bond pads 408 provide new 3D printed bond conductor 212 attachment points between the interposer 304 and package leads 320 and downbonds of the new integrated circuit package base 308.

In most applications, the interposer 304 is designed so that the second bond pads 408 are as close as possible to the package lead 320 that each second bond pad 408 becomes bonded to. This may require routing connections between some first bond pads 404 and second bond pads 408 across most of the interposer 304. To some extent the routing length of such connections may be mitigated by orienting the extracted die location 412 clockwise or counterclockwise on the interposer 304, and this must be independently evaluated for each extracted die 100 and interposer 304 combination.

It is important to match the interposer pad 404, 408 geometry and spacing to the printing capabilities of the 3D printing apparatus being used to apply the 3D printed bond connections 216. The manufacturer of such devices specifies printing tolerances and variation based on many factors, including environmental conditions and following a prescribed maintenance schedule.

Referring now to FIG. 5A, an illustration depicting a top view of a new package base 308 before 3D printing bond connections 216 in accordance with embodiments of the present invention is shown. The remapped extracted die 324 is securely mounted in the cavity 316 of the new package base 308 with die attach adhesive 312. The new package base 308 has a plurality of package base bond pads 504, which provide a conduction path to the package leads 320 on the exterior of the new package base 308. One package lead 320 is provided on the exterior of the new package base 308 for every package base bond pad 504. FIG. 5A reflects the same level of assembly as shown in FIG. 3C.

Referring now to FIG. 5B, an illustration depicting a top view of a new package base 308 after 3D printing bond connections 216 in accordance with embodiments of the present invention is shown. FIG. 5B illustrates the same point in the assembly process as also shown in FIGS. 3B and 3D. The new package base 308 is fully assembled, and is ready for a package lid 344 to be added or else encapsulation as a molded packaged integrated circuit 340.

As shown in FIG. 5B, the new package base 308 has new 3D printed bond connections 216 added. New 3D printed bond connections 216 connect original bond pads 104. 108 of the extracted die 100 to the first bond pads 404 (usually but not necessarily, closest to the extracted die 100) of the interposer 304. Other new 3D printed bond connections 216 connect the second bond pads 408 (usually but not necessarily, closest to the edge of the interposer 304) of the interposer 304 to package base bond pads 504.

It is possible that some original bond pads 104, 108 of the extracted die 100 and package base bond pads 504 will be no connects 508, 512. No connects 508, 512 will not have a new 3D printed bond connection 216 attached. In FIG. 5B, there are two no connects 512 on the original bond pads 104, 108 of the extracted die 100, and two no connects 508 on the package base bond pads 504. However, there may practically be any number of no connects 508, 512, even zero.

Since 3D printed bond connections 216 include 3D printed bond conductors 212 and possibly 3D printed bond insulators 220, it should be understood that 3D printed bond insulators 220 may possibly be present or not present in every such 3D printed bond connections 216 shown. Additionally, 3D printed bond insulators 220 may only be present for a portion of the length of a given 3D printed bond connection 216.

Referring now to FIG. 5C, an illustration depicting a top view of a new package base 308 after 3D printing some crossed bond connections 516 in accordance with embodiments of the present invention is shown. FIG. 5C is similar to FIG. 5B, but illustrates a crossed 3D printed bond connection 516 between a pair of interposer second bond pads 408 and package leads 320. One of the advantages of the present invention is by providing conformal sprayed bond connections 216 it is possible to overlap 3D printed bond connections and cross connections 516 as long as a 3D printed bond insulator 220 isolates the crossed pair of 3D printed bond conductors 212. In contrast, crossed bond wires are at least not recommended if not forbidden (military applications, for example). Conventional bond wires have a free mass that may be able to move depending on shock and vibration intensity and duration. This may either result in shorting to adjacent bond wires or weakening of bond wire/ball bond junctions. Because 3D printed bond connections 216 are conformal and adhere to surfaces over which they are applied, they have no such free mass and risk of shorting or weakening.

Crossed 3D printed bond conductors 516 allows great flexibility by not requiring different interposers 304 for each package type or package pinout variation. Therefore, a single interposer 304 may be used to relocate a majority of signals while crossed 3D printed bond connections 516 remap a smaller number of difference signals.

Referring now to FIG. 6A, a flowchart illustrating an assembly method for a new packaged integrated circuit 340 in accordance with a first embodiment of the present invention is shown. Flow begins at block 604.

At block 604, an extracted die 100 is removed from previous packaged integrated circuit. The extracted die 100 will have at least one original ball bond 112 and one original bond wire 116. It is possible that some or all original bond wires 116 will be removed during the die extraction process. Flow proceeds to block 608.

At block 608, original bond wires 116 are removed from original ball bonds 112 of extracted die 100, if any original bond wires 116 are still present. Flow proceeds to block 612.

At block 612, the extracted die 100 is bonded to the interposer 304 to create a remapped extracted die 324. Flow proceeds to block 616.

At block 616, die attach adhesive 312 is applied to the cavity 316. Flow proceeds to block 620.

At block 620, the remapped extracted die 324 is placed into the cavity 316 to secure the remapped extracted die 324 to the new package base 308. As an alternative to blocks 612-620, the interposer 304 may first be bonded to the new package base 308, then the extracted die 100 may be bonded to the interposer 304. Flow proceeds to blocks 624 and 628.

At block 624, new 3D printed bond connections 216 are provided between original bond pads 104, 108 of the extracted die 100 and the first set of bond pads 404 of the interposer 304. If there is an original ball bond 112 on an original bond pad 104 of the extracted die 100, a 3D printed bond conductor 212 covers the original ball bond 112 and original bond pad 104. Flow proceeds to block 632.

At block 628, new 3D printed bond connections 216 are provided between the second bond pads 408 of the interposer 304 and package leads 320 or downbonds, as required. It should be noted that steps 624 and 628 may be completed in any order, depending on what new 3D printed bond connection 216 installation produces the most efficient and reliable process. Flow proceeds to block 632.

At block 632, the package lid 344 is sealed to the assembled package base 340, or alternatively, the non-hermetic packaged integrated circuit 340 is encapsulated. Flow proceeds to block 636.

At block 636, the packaged integrated circuit 340 is electrically tested. Electrical testing includes continuity tests or functional tests, or both. If the packaged integrated circuit 340 has passed the electrical tests, and the package leads 320 are properly trimmed, the packaged integrated circuit 340 is marked and is a complete new packaged integrated circuit 340 ready for use. Flow ends at block 636.

Referring now to FIG. 6B, a flowchart illustrating an assembly method for a new packaged integrated circuit 340 in accordance with a second embodiment of the present invention is shown. Flow begins at block 650.

At block 650, an extracted die 100 is removed from previous packaged integrated circuit. The extracted die 100 will have at least one original ball bond 112 and possibly at least one original bond wire 116. It is possible that some or all original bond wires 116 will be removed during the die extraction process. Flow proceeds to block 654.

At block 654, original bond wires 116 and original ball bonds 112 are removed from extracted die 100. Flow proceeds to block 658.

At block 658, the original bond pads 104, 108 of the extracted die 100 are prepared for rebonding. In one embodiment, preparation includes removing any impurities from original bond pads 104, 108 and prepares the original bond pads 104, 108 to accept new 3D printed bond connections 216. Residues and/or oxides are removed. In some embodiments, the original bond pads 104, 108 are lapped in order to create a flatter pad bonding surface. In yet another embodiment, the original bond pads 104, 108 are reconditioned using an ENEPIG or similar layered metallization process, usually after removing residues and/or oxides, and possibly following lapping. Flow proceeds to block 662.

At block 662, the extracted die 100 is bonded to the interposer 304 to create a remapped extracted die 324. Flow proceeds to block 666.

At block 666, die attach adhesive 312 is applied to the cavity 316. Flow proceeds to block 670.

At block 670, the remapped extracted die 324 is placed into the cavity 316 to secure the remapped extracted die 324 to the new package base 308. As an alternative to blocks 662-670, the interposer 304 may first be bonded to the new package base 308, then the extracted die 100 may be bonded to the interposer 304. Flow proceeds to blocks 674 and 678.

At block 674, new 3D printed bond connections 216 are provided between original bond pads 104, 108 of the extracted die 100 and the first bond pads 404 of the interposer 304. Flow proceeds to block 682.

At block 678, new 3D printed bond connections 216 are provided between the second bond pads 408 of the interposer 304 and package leads 320 or downbonds, as required. It should be noted that steps 674 and 678 may be completed in any order, depending on what new 3D printed bond connection 216 installation produces the most efficient and reliable process. Flow proceeds to block 682.

At block 682, the package lid 344 is sealed to the assembled package base 340, or alternatively, the non-hermetic packaged integrated circuit 340 is encapsulated. Flow proceeds to block 686.

At block 686, the packaged integrated circuit 340 is electrically tested. Electrical testing includes continuity tests or functional tests, or both. If the packaged integrated circuit 340 has passed the electrical tests, and the package leads 320 are properly trimmed, the packaged integrated circuit 340 is marked and is a complete new packaged integrated circuit 340 ready for use. Flow ends at block 686.

Referring now to FIG. 7A, a flowchart illustrating an assembly method for a new packaged integrated circuit 340 in accordance with a third embodiment of the present invention is shown. Flow begins at block 704.

At block 704, an extracted die 100 is removed from previous packaged integrated circuit. The extracted die 100 will have at least one original ball bond 112 and possibly at least one original bond wire 116. It is possible that some or all original bond wires 116 will be removed during the die extraction process. Flow proceeds to block 708.

At block 708, original bond wires 116 are removed from original ball bonds 112 of extracted die 100, if any original bond wires 116 are still present. Flow proceeds to block 712.

At block 712, the extracted die 100 is bonded to the interposer 304 to create a remapped extracted die 324. Flow proceeds to block 716.

At block 716, new 3D printed bond connections 216 are provided between original bond pads 104, 108 of the extracted die 100 and the first bond pads 404 of the interposer 304. If there is an original ball bond 112 on an original bond pad 104 of the extracted die 100, a 3D printed bond conductor 212 covers the original ball bond 112 and original bond pad 104. Flow proceeds to block 720.

At block 720, die attach adhesive 312 is applied to the cavity 316. Flow proceeds to block 724.

At block 724, the remapped extracted die 324 is placed into the cavity 316 to secure the remapped extracted die 324 to the new package base 308. Flow proceeds to block 728.

At block 728, new 3D printed bond connections 216 are provided between the second bond pads 408 of the interposer 304 and package leads 320 or downbonds, as required. Flow proceeds to block 732.

At block 732, the package lid 344 is sealed to the assembled package base 340, or alternatively, the non-hermetic packaged integrated circuit 340 is encapsulated. Flow proceeds to block 736.

At block 736, the packaged integrated circuit 340 is electrically tested. Electrical testing includes continuity tests or functional tests, or both. If the packaged integrated circuit 340 has passed the electrical tests, and the package leads 320 are properly trimmed, the packaged integrated circuit 340 is marked and is a complete new packaged integrated circuit 340 ready for use. Flow ends at block 736.

Referring now to FIG. 7B, a flowchart illustrating an assembly method for a new packaged integrated circuit 340 in accordance with a fourth embodiment of the present invention is shown. Flow begins at block 750.

At block 750, an extracted die 100 is removed from previous packaged integrated circuit. The extracted die 100 will have at least one original ball bond 112 and one original bond wire 116. It is possible that some or all original bond wires 116 will be removed during the die extraction process. Flow proceeds to block 754.

At block 754, original bond wires 116 and original ball bonds 112 are removed from the extracted die 100. Flow proceeds to block 758.

At block 758, the original bond pads 104, 108 of the extracted die 100 are prepared for rebonding. In one embodiment, preparation includes removing any impurities from original bond pads 104, 108 and prepares the original bond pads 104, 108 to accept new 3D printed bond connections 216. Residues and/or oxides are removed. In some embodiments, the original bond pads 104, 108 are lapped in order to create a flatter pad bonding surface. In yet another embodiment, the original bond pads 104, 108 are reconditioned using an ENEPIG or similar layered metallization process, usually after removing residues and/or oxides, and possibly following lapping. Flow proceeds to block 762.

At block 762, the extracted die 100 is bonded to the interposer 304 to create a remapped extracted die 324. Flow proceeds to block 766.

At block 766, new 3D printed bond connections 216 are provided between original bond pads 104, 108 of the extracted die 100 and the first bond pads 404 of the interposer 304. Flow proceeds to block 770.

At block 770, die attach adhesive 312 is applied to the cavity 316. Flow proceeds to block 774.

At block 774, the remapped extracted die 324 is placed into the cavity 316 to secure the remapped extracted die 324 to the new package base 308. Flow proceeds to block 778.

At block 778, new 3D printed bond connections 216 are provided between the second bond pads 408 of the interposer 304 and package leads 320 or downbonds, as required. Flow proceeds to block 782.

At block 782, the package lid 344 is sealed to the assembled package base 340, or alternatively, the non-hermetic packaged integrated circuit 340 is encapsulated. Flow proceeds to block 786.

At block 786, the packaged integrated circuit 340 is electrically tested. Electrical testing includes continuity tests or functional tests, or both. If the packaged integrated circuit 340 has passed the electrical tests, and the package leads 320 are properly trimmed, the packaged integrated circuit 340 is marked and is a complete new packaged integrated circuit 340 ready for use. Flow ends at block 786.

Referring now to FIG. 8A, a flowchart illustrating an assembly method for a hermetic packaged integrated circuit 352 in accordance with a first hermetic embodiment of the present invention is shown. Flow begins at block 804.

At block 804, an extracted die 100 is removed from previous packaged integrated circuit. The extracted die 100 will have at least one original ball bond 112 and one original bond wire 116. It is possible that some or all original bond wires 116 will be removed during the die extraction process. Flow proceeds to block 808.

At block 808, original bond wires 116 are removed from original ball bonds 112 of extracted die 100, if any original bond wires 116 are still present. Flow proceeds to block 812.

At block 812, the extracted die 100 is bonded to the interposer 304 to create a remapped extracted die 324. Flow proceeds to block 816.

At block 816, a low-halide content die attach adhesive 312 is applied to the cavity 316. Flow proceeds to block 820.

At block 820, the remapped extracted die 324 is placed into the cavity 316 to secure the remapped extracted die 324 to the new package base 308. As an alternative to blocks 812-820, the interposer 304 may first be bonded to the new package base 308, then the extracted die 100 may be bonded to the interposer 304. Flow proceeds to blocks 824 and 828.

At block 824, new 3D printed bond connections 216 are provided between original bond pads 104, 108 of the extracted die 100 and the first bond pads 404 of the interposer 304. Flow proceeds to block 832.

At block 828, new 3D printed bond connections 216 are provided between the second bond pads 408 of the interposer 304 and package leads 320 or downbonds, as required. It should be noted that steps 824 and 828 may be completed in any order, depending on what new 3D printed bond connection 216 installation produces the most efficient and reliable process. Flow proceeds to block 832.

At block 832, the assembled hermetic package base 328, 336 is first vacuum baked. The assembled hermetic package base 328, 336 includes the hermetic package base 308, package leads 320, remapped extracted die 324, the die attach adhesive 312, and new 3D printed bond connections 216. The process of first vacuum baking is illustrated in FIG. 11 of application Ser. No. 13/623,603. Flow proceeds to block 836.

At block 836, the assembled hermetic package base 328, 336 is removed from the vacuum baking apparatus and the hermetic package lid 344 is placed on the assembled hermetic package base 328, 336. The hermetic package lid 344 is placed in proper orientation such that the combination of the hermetic package lid 344 and the assembled hermetic package base 328, 336 is hermetically sealed following block 840. A moisture getter 356 in some embodiments is applied to the interior of the hermetic package lid 344. In a preferred embodiment, the moisture getter 356 is uniformly applied with a thickness of three or more microns to the interior surface of the hermetic package lid 344 using a deposition process. Flow proceeds to block 840.

At block 840, the assembled hermetic package base 328, 336 and hermetic package lid 344 are placed into the vacuum baking apparatus and second vacuum baked. Unlike block 832, where only the assembled hermetic package base 328, 336 is first vacuum baked, block 840 requires the hermetic package lid 344 to be placed on the assembled hermetic package base 328, 336 prior to initiating the second vacuum bake process. The second vacuum bake process is illustrated in FIG. 12 of application Ser. No. 13/623,603. Flow proceeds to block 844.

At block 844, a vacuum pump in the vacuum baking apparatus is turned off. Turning the vacuum pump off prevents gases from being evacuated from the vacuum baking apparatus, and is required in order for Noble gas 360 injected in block 848 to remain in the packaged hermetic integrated circuit 352 after the hermetic package lid 344 is sealed to the assembled hermetic package base 328, 336. Flow proceeds to block 848.

At block 848, a Noble gas 360 is injected into the packaged hermetic integrated circuit 352, while the packaged hermetic integrated circuit 352 is in the vacuum baking apparatus, and immediately following the second vacuum bake process. In a preferred embodiment, the Noble gas 360 is Argon, and the Noble gas 360 is injected into the cavity 316 to a pressure of between 0.1 to 2 Atmospheres (ATM), preferably 1 ATM, at a temperature between 200° C. and 275° C., preferably 255° C. Flow proceeds to block 852.

At block 852, the packaged hermetic integrated circuit 352 is hermetically and/or electrically tested. Hermetic testing is generally performed according to MIL-SPEC-883H. Electrical testing includes either continuity tests or functional tests, or both. If the packaged hermetic integrated circuit 352 has passed the hermeticity and electrical tests and the package leads 320 are properly trimmed to the appropriate length, the packaged hermetic integrated circuit 352 is marked and is a complete hermetic integrated circuit 352 ready for use. Flow ends at block 852.

The process illustrated and described in FIG. 8A is most suitable for applications with temperatures over 150 degrees Celsius where either original ball bonds 112 have not been removed from the extracted die 100 or the original bond pads 104, 108 have not been reconditioned as described herein.

Referring now to FIG. 8B, a flowchart illustrating an assembly method for a hermetic packaged integrated circuit 352 in accordance with a second hermetic embodiment of the present invention is shown. Flow begins at block 856.

At block 856, an extracted die 100 is removed from previous packaged integrated circuit. The extracted die 100 will have at least one original ball bond 112 and possibly at least one original bond wire 116. It is possible that some or all original bond wires 116 will be removed during the die extraction process. Flow proceeds to block 860.

At block 860, original bond wires 116 are removed from original ball bonds 112 of extracted die 100. Flow proceeds to block 864.

At block 864, the original bond pads 104, 108 of the extracted die 100 are prepared for rebonding. In one embodiment, preparation includes removing any impurities from original bond pads 104, 108 and prepares the original bond pads 104, 108 to accept new 3D printed bond connections 216. Residues and/or oxides are removed. In some embodiments, the original bond pads 104, 108 are lapped in order to create a flatter pad bonding surface. In yet another embodiment, the original bond pads 104, 108 are reconditioned using an ENEPIG or similar layered metallization process, usually after removing residues and/or oxides, and possibly following lapping. Flow proceeds to block 868.

At block 868, the extracted die 100 is bonded to the interposer 304 to create a remapped extracted die 324. Flow proceeds to block 872.

At block 872, a low-halide content die attach adhesive 312 is applied to the cavity 316. Flow proceeds to block 876.

At block 876, the remapped extracted die 324 is placed into the cavity 316 to secure the remapped extracted die 324 to the new package base 308. As an alternative to blocks 868-876, the interposer 304 may first be bonded to the new package base 308, then the extracted die 100 may be bonded to the interposer 304. Flow proceeds to blocks 880 and 884.

At block 880, new 3D printed bond connections 216 are provided between original bond pads 104, 108 of the extracted die 100 and the first bond pads 404 of the Interposer 304. Flow proceeds to block 888.

At block 884, new 3D printed bond connections 216 are provided between the second bond pads 408 of the interposer 304 and package leads 320 or downbonds, as required. It should be noted that steps 880 and 884 may be completed in any order, depending on what new 3D printed bond connection 216 installation produces the most efficient and reliable process. Flow proceeds to block 888.

At block 888, the assembled hermetic package base 328, 336 is first vacuum baked. The assembled hermetic package base 328, 336 includes the hermetic package base 308, package leads 320, remapped extracted die 324, the die attach adhesive 312, and new 3D printed bond connections 216. The process of first vacuum baking is illustrated in FIG. 11 of application Ser. No. 13/623,603. Flow proceeds to block 890.

At block 890, the assembled hermetic package base 328, 336 is removed from the vacuum baking apparatus and the hermetic package lid 344 is placed on the assembled hermetic package base 328, 336. The hermetic package lid 344 is placed in proper orientation such that the combination of the hermetic package lid 344 and the assembled hermetic package base 328, 336 is hermetically sealed following block 892. In some embodiments, a moisture getter 356 is applied to the interior of the hermetic package lid 344. In a preferred embodiment, the moisture getter 356 is uniformly applied with a thickness of three or more microns to the interior surface of the hermetic package lid 344 using a deposition process. Flow proceeds to block 892.

At block 892, the assembled hermetic package base 328, 336 and hermetic package lid 344 are placed into the vacuum baking apparatus and second vacuum baked. Unlike block 888, where only the assembled hermetic package base 328, 336 is first vacuum baked, block 892 requires the hermetic package lid 344 to be placed on the assembled hermetic package base 328, 336 prior to initiating the second vacuum bake process. The second vacuum bake process is illustrated in FIG. 12 of application Ser. No. 13/623,603. Flow proceeds to block 894.

At block 894, a vacuum pump in the vacuum baking apparatus is turned off. Turning the vacuum pump off prevents gases from being evacuated from the vacuum baking apparatus, and is required in order for Noble gas 360 injected in block 896 to remain in the packaged hermetic integrated circuit 352 after the hermetic package lid 344 is sealed to the assembled hermetic package base 328, 336. Flow proceeds to block 896.

At block 896, a Noble gas 360 is injected into the packaged hermetic integrated circuit 328, 336, while the packaged hermetic integrated circuit 328, 336 is in the vacuum baking apparatus, and immediately following the second vacuum bake process. In a preferred embodiment, the Noble gas 360 is Argon, and the Noble gas 360 is injected into the cavity 316 to a pressure of between 0.1 to 2 Atmospheres (ATM), preferably 1 ATM, at a temperature between 200° C. and 275° C., preferably 255° C. Flow proceeds to block 898.

At block 898, the packaged hermetic integrated circuit 352 is hermetically and/or electrically tested. Hermetic testing is generally performed according to MIL-SPEC-883H. Electrical testing includes either continuity tests or functional tests, or both. If the packaged hermetic integrated circuit 352 has passed the hermeticity and electrical tests and the package leads 320 are properly trimmed to the appropriate length, the packaged hermetic integrated circuit 352 is marked and is a complete hermetic integrated circuit 352, ready for use. Flow ends at block 898.

The process illustrated and described in FIG. 8B is most suitable for applications with temperatures over 150 degrees Celsius where either original ball bonds 112 have not been removed from the extracted die 100 or the original bond pads 104, 108 have not been reconditioned as described herein.

Referring now to FIG. 9A, a flowchart illustrating an assembly method for a hermetic packaged integrated circuit 352 in accordance with a third hermetic embodiment of the present invention is shown. Flow begins at block 904.

At block 904, an extracted die 100 is removed from previous packaged integrated circuit. The extracted die 100 will have at least one original ball bond 112 and possibly at least one original bond wire 116. It is possible that some or all original bond wires 116 will be removed during the die extraction process. Flow proceeds to block 908.

At block 908, original bond wires 116 are removed from original ball bonds 112 of extracted die 100, if any original bond wires 116 are still present. Flow proceeds to block 912.

At block 912, the extracted die 100 is bonded to the interposer 304 to create a remapped extracted die 324. Flow proceeds to block 916.

At block 916, new 3D printed bond connections 216 are provided between original bond pads 104, 108 of the extracted die 100 and the first bond pads 404 of the interposer 304. Flow proceeds to block 920.

At block 920, a low-halide content die attach adhesive 312 is applied to the cavity 316. Flow proceeds to block 924.

At block 924, the remapped extracted die 324 is placed into the cavity 316 to secure the remapped extracted die 324 to the new package base 308. Flow proceeds to block 928.

At block 928, new 3D printed bond connections 216 are provided between the second bond pads 408 of the interposer 304 and package leads 320 or downbonds, as required. Flow proceeds to block 932.

At block 932, the assembled hermetic package base 328, 336 is first vacuum baked. The assembled hermetic package base 328, 336 includes the hermetic package base 308, package leads 320, remapped extracted die 324, the die attach adhesive 312, and new 3D printed bond connections 216. The process of first vacuum baking is illustrated in FIG. 11 of application Ser. No. 13/623,603. Flow proceeds to block 936.

At block 936, the assembled hermetic package base 328, 336 is removed from the vacuum baking apparatus and the hermetic package lid 344 is placed on the assembled hermetic package base 328, 336. The hermetic package lid 344 is placed in proper orientation such that the combination of the hermetic package lid 344 and the assembled hermetic package base 328, 336 is hermetically sealed following block 940. In some embodiments, a moisture getter 356 is applied to the interior of the hermetic package lid 344. In a preferred embodiment, the moisture getter 356 is uniformly applied with a thickness of three or more microns to the interior surface of the hermetic package lid 344 using a deposition process. Flow proceeds to block 940.

At block 940, the assembled hermetic package base 328, 336 and hermetic package lid 344 are placed into the vacuum baking apparatus and second vacuum baked. Unlike block 932, where only the assembled hermetic package base 328, 336 is first vacuum baked, block 940 requires the hermetic package lid 344 to be placed on the assembled hermetic package base 328, 336 prior to initiating the second vacuum bake process. The second vacuum bake process is illustrated in FIG. 12 of application Ser. No. 13/623,603. Flow proceeds to block 944.

At block 944, a vacuum pump in the vacuum baking apparatus is turned off. Turning the vacuum pump off prevents gases from being evacuated from the vacuum baking apparatus, and is required in order for Noble gas 360 injected in block 948 to remain in the packaged hermetic integrated circuit 952 after the hermetic package lid 344 is sealed to the assembled hermetic package base 328, 336. Flow proceeds to block 948.

At block 948, a Noble gas 360 is injected into the packaged hermetic integrated circuit 352, while the packaged hermetic integrated circuit 352 is in the vacuum baking apparatus, and immediately following the second vacuum bake process. In a preferred embodiment, the Noble gas 360 is Argon, and the Noble gas 360 is injected into the cavity 316 to a pressure of between 0.1 to 2 Atmospheres (ATM), preferably 1 ATM, at a temperature between 200° C. and 275° C., preferably 255° C. Flow proceeds to block 952.

At block 952, the packaged hermetic integrated circuit 352 is hermetically and/or electrically tested. Hermetic testing is generally performed according to MIL-SPEC-883H. Electrical testing includes either continuity tests or functional tests, or both. If the packaged hermetic integrated circuit 352 has passed the hermeticity and electrical tests and the package leads 320 are properly trimmed to the appropriate length, the packaged hermetic integrated circuit 352 is marked and is a complete hermetic integrated circuit 352 ready for use. Flow ends at block 952.

The process illustrated and described in FIG. 9A is most suitable for applications with temperatures over 150 degrees Celsius where either original ball bonds 112 have not been removed from the extracted die 100 or the original bond pads 104, 108 have not been reconditioned as described herein.

Referring now to FIG. 9B, a flowchart illustrating an assembly method for a hermetic packaged integrated circuit 352 in accordance with a fourth hermetic embodiment of the present invention is shown. Flow begins at block 956.

At block 956, an extracted die 100 is removed from previous packaged integrated circuit. The extracted die 100 will have at least one original ball bond 112 and possibly at least one original bond wire 116. It is possible that some or all original bond wires 116 will be removed during the die extraction process. Flow proceeds to block 960.

At block 960, original bond wires 116 are removed from original ball bonds 112 of extracted die 100. Flow proceeds to block 964.

At block 964, the original bond pads 104, 108 of the extracted die 100 are prepared for rebonding. In one embodiment, preparation includes removing any impurities from original bond pads 104, 108 and prepares the original bond pads 104, 108 to accept new 3D printed bond connections 216. Residues and/or oxides are removed. In some embodiments, the original bond pads 104, 108 are lapped in order to create a flatter pad bonding surface. In yet another embodiment, the original bond pads 104, 108 are reconditioned using an ENEPIG or similar layered metallization process, usually after removing residues and/or oxides, and possibly following lapping. Flow proceeds to block 968.

At block 968, the extracted die 100 is bonded to the interposer 304 to create a remapped extracted die 324. Flow proceeds to block 972.

At block 972, new 3D printed bond connections 216 are provided between original bond pads 104, 108 of the extracted die 100 and the first bond pads 404 of the interposer 304. Flow proceeds to block 976.

At block 976, a low-halide content die attach adhesive 312 is applied to the cavity 316. Flow proceeds to block 980.

At block 980, the remapped extracted die 324 is placed into the cavity 316 to secure the remapped extracted die 324 to the new package base 308. Flow proceeds to block 984.

At block 984, new 3D printed bond connections 216 are provided between the second bond pads 408 of the interposer 304 and package leads 320 or downbonds, as required. It should be noted that steps 880 and 884 may be completed in any order, depending on what new 3D printed bond connection 216 installation produces the most efficient and reliable process. Flow proceeds to block 988.

At block 988, the assembled hermetic package base 328, 336 is first vacuum baked. The assembled hermetic package base 328, 336 includes the hermetic package base 308, package leads 320, remapped extracted die 324, the die attach adhesive 312, and new 3D printed bond connections 216. The process of first vacuum baking is illustrated in FIG. 11 of application Ser. No. 13/623,603. Flow proceeds to block 990.

At block 990, the assembled hermetic package base 328, 336 is removed from the vacuum baking apparatus and the hermetic package lid 344 is placed on the assembled hermetic package base 328, 336. The hermetic package lid 344 is placed in proper orientation such that the combination of the hermetic package lid 344 and the assembled hermetic package base 328, 336 is hermetically sealed following block 992. In some embodiments, a moisture getter 356 is applied to the interior of the hermetic package lid 344. In a preferred embodiment, the moisture getter 356 is uniformly applied with a thickness of three or more microns to the interior surface of the hermetic package lid 344 using a deposition process. Flow proceeds to block 992.

At block 992, the assembled hermetic package base 328, 336 and hermetic package lid 344 are placed into the vacuum baking apparatus and second vacuum baked. Unlike block 988, where only the assembled hermetic package base 328, 336 is first vacuum baked, block 992 requires the hermetic package lid 344 to be placed on the assembled hermetic package base 328, 336 prior to initiating the second vacuum bake process. The second vacuum bake process is illustrated in FIG. 12 of application Ser. No. 13/623,603. Flow proceeds to block 994.

At block 994, a vacuum pump in the vacuum baking apparatus is turned off. Turning the vacuum pump off prevents gases from being evacuated from the vacuum baking apparatus, and is required in order for Noble gas 360 injected in block 996 to remain in the packaged hermetic integrated circuit 352 after the hermetic package lid 344 is sealed to the assembled hermetic package base 328, 336. Flow proceeds to block 996.

At block 996, a Noble gas 360 is injected into the packaged hermetic integrated circuit 328, 336, while the packaged hermetic integrated circuit 328, 336 is in the vacuum baking apparatus, and immediately following the second vacuum bake process. In a preferred embodiment, the Noble gas 360 is Argon, and the Noble gas 360 is injected into the cavity 316 to a pressure of between 0.1 to 2 Atmospheres (ATM), preferably 1 ATM, at a temperature between 200° C. and 275° C., preferably 255° C. Flow proceeds to block 998.

At block 998, the packaged hermetic integrated circuit 352 is hermetically and/or electrically tested. Hermetic testing is generally performed according to MIL-SPEC-883H. Electrical testing includes either continuity tests or functional tests, or both. If the packaged hermetic integrated circuit 352 has passed the hermeticity and electrical tests and the package leads 320 are properly trimmed to the appropriate length, the packaged hermetic integrated circuit 352 is marked and is a complete hermetic integrated circuit 352, ready for use. Flow ends at block 998.

The process illustrated and described in FIG. 9B is most suitable for applications with temperatures over 150 degrees Celsius where either original ball bonds 112 have not been removed from the extracted die 100 or the original bond pads 104, 108 have not been reconditioned as described herein.

Referring now to FIG. 10, an illustration depicting insulating and conducting material spray with a 3D printer in accordance with the present invention is shown. 3D printers are able to precisely deposit insulating or conducting material on complex shapes, and are able to build up or layer the insulating or conducting material to a precise thickness.

The 3D printer includes a 3D printer conductive material spray head 1004, which applies bond insulator material 1012 or bond conductor material 1016 to selected areas of the assembled package base 328, 336. 3D printers typically deposit material in layers, and build up a desired thickness of material by depositing multiple layers. The 3D printer is computer controlled equipment, and sprays material according to a file or files prepared beforehand designating specific locations that material will be applied to.

In one embodiment, the 3D printer uses an extrusion process to apply either the bond insulator material 1012 or the bond conductor material 1016, or both. The extrusion process, sometimes referred to as Fused Deposition Modeling (FDM) uses a heated nozzle to extrude molten material.

In another embodiment, the 3D printer uses a Colorjet Printing (CJP) process to apply either the bond insulator material 1012 or the bond conductor material 1016, or both. The CJP process utilizes an inkjet-based technology to spread fine layers of a dry substrate material. The dry substrate is most often in a powder form. The inkjet applies a binder to the substrate after applying the dry substrate material in order to solidify and cure the dry substrate.

In the preferred embodiment, the 3D printer uses a selective laser sintering process. Either bond insulator material 1012 or bond conductor material 1016 is applied in powder form to the assembled package base 328, 336.

The bond insulator material 1012 is a material able to be applied in powder form or extruded, and is generally a polymer or plastic. However, any material having suitable insulation properties, able to adhere to the assembled package base 328, 336, and able to be applied with a 3D printer material spray head 1004 is suitable as bond insulator material 1012.

The bond conductor material 1016 is also a material able to be applied in powder form or extruded, and includes at least conductive metal and possibly polymer or plastic content in order to provide elastomeric or resilient properties. In the preferred embodiment, the metal content is silver. In other embodiments, the material may include alone or in combination gold, aluminum, or copper.

Referring now to FIG. 11, an illustration depicting a sintering process to form a 3D printed bond insulator 220 or a 3D printed bond conductor 212 in accordance with embodiments of the present invention is shown. The sintering process is a second step of the 3D printing process used in the preferred embodiment of the invention. A laser 1104 aims a laser beam 1108 at the applied bond insulator material 1012 or bond conductor material 1016 to convert the applied material 1012, 1016 into a 3D printed bond insulator 220 or a 3D printed bond conductor 212, respectively. The laser beam 1108 converts the powder form applied material 1012, 1016 into a molten compound with liquid properties that forms a smooth solid compound when it cools. The smooth solid compound is either the 3D printed bond insulator 220 or 3D printed bond conductor 212.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

We claim:

1. An integrated circuit, comprising:
   a package base comprising package leads;
   an extracted die removed from a previous packaged integrated circuit, comprising:
      original bond pads; and
      one or more original ball bonds on the original bond pads;
   layers of nickel, palladium, and gold over one or more original bond pads or the one or more original ball bonds;
   an interposer bonded to the extracted die and the package base, comprising:
      first bond pads electrically connected to the original bond pads with 3D printed first bond connections conforming to the shapes and surfaces of the extracted die, the one or more original ball bonds, and the interposer; and
      second bond pads electrically connected to the package leads with 3D printed second bond connections conforming to shapes and surfaces of the interposer and package base.

2. The integrated circuit of claim 1, wherein each of the one or more 3D printed bond connections comprises a 3D printed bond insulator and a 3D printed bond conductor, wherein 3D printed bond insulators prevents electrical conduction between 3D printed bond conductors and at least one of the extracted die, the interposer, and the package base.

3. The integrated circuit of claim 1, wherein the extracted die is a fully functional semiconductor die that has been removed from a finished packaged integrated circuit.

4. The integrated circuit of claim 2, wherein each of the 3D printed bond insulators comprises a polymer material having elastomeric properties.

5. The integrated circuit of claim 2, wherein each of the 3D printed bond conductors comprises an elastomeric material and at least one of gold, aluminum, and copper, wherein for original bond pads having original ball bonds present 3D printed bond conductors cover and conform to the surfaces of the original ball bonds and original bond pads.

6. The integrated circuit of claim 2, wherein 3D printed bond conductors are applied over and conform to the surface of the 3D printed bond insulators, wherein the 3D printed bond conductors and conductive traces of the interposer make electrical contact between the original bond pads and the package leads.

7. The integrated circuit of claim 1, wherein after 3D printing the bond connections, there are no bond wires attached to the integrated circuit.

8. The integrated circuit of claim 1, further comprising:
   one of a package lid secured to the package base or the integrated circuit encapsulated within an encapsulation compound to create a new packaged integrated circuit.

9. The integrated circuit of claim 8, wherein the package base is a hermetic package base, the package lid is a hermetic package lid, and the packaged integrated circuit is a hermetic packaged integrated circuit.

10. An integrated circuit, comprising:
    a package base comprising package leads;
    a reconditioned die, comprising:
       a modified extracted die with reconditioned bond pads, the modified extracted die comprising an extracted die with no ball bonds on original bond pads of the extracted die, the extracted die comprising a fully functional semiconductor die with one or more ball bonds on one or more original bond pads, the reconditioned bond pads comprising layers of nickel, palladium, and gold over the original bond pads;
    an interposer bonded to the reconditioned die and the package base, comprising:
       first bond pads electrically connected to the original bond pads with 3D printed first bond connections conforming to the shapes and surfaces of the reconditioned die and the interposer; and second bond pads electrically connected to the package leads or downbonds with 3D printed second bond connections conforming to shapes and surfaces of the interposer and package base, 3D printed first and second bond connections each comprising 3D printed bond conductors, comprising a compound comprising an elastomeric material and at least one of gold, aluminum, or copper.

11. The integrated circuit of claim 10, wherein the nickel layer being in direct contact with the original bond pads, the palladium layer between the nickel and gold layers, and the gold layer over the palladium layer.

12. The integrated circuit of claim 10, wherein at least one 3D printed first or second bond connection comprises a 3D printed bond conductor applied over a 3D printed bond insulator.

13. The integrated circuit of claim 12, wherein the 3D printed bond insulator comprises polymer material that prevents electrical conduction between the 3D printed bond conductor and at least one of the package base, a package lid, a die attach adhesive between the interposer and package base, the interposer, and areas of the extracted die other than an original bond pad.

14. The integrated circuit of claim 12, wherein the 3D printed bond insulator covers at least a portion of a first 3D printed bond conductor and prevents electrical conduction between the first 3D printed bond conductor and a second 3D printed bond conductor above and conformal with the at least one 3D printed bond insulator.

15. The integrated circuit of claim 10, further comprising: a package lid secured to the package base to create a packaged integrated circuit.

16. The integrated circuit of claim 15, wherein the interposer comprises a substrate comprising a plurality of first and second bond pads and predetermined interconnections between the plurality of first and second bond pads.

17. An integrated circuit, comprising:
a package base comprising package leads;
a modified extracted die, comprising original bond pads and no original ball bonds or bond wires on the original bond pads, comprising:
an extracted die removed from a previous packaged integrated circuit, comprising:
one or more original ball bonds on the original bond pads;
layers of nickel, palladium, and gold over one or more original bond pads;
an interposer bonded to the modified extracted die and the package base, comprising:
first bond pads electrically connected to the original bond pads with first 3D printed bond conductors conforming to the shapes and surfaces of the modified extracted die and the interposer; and
second bond pads electrically connected to the package leads with second 3D printed bond conductors conforming to shapes and surfaces of the interposer and package base.

18. The integrated circuit of claim 17, further comprising:
at least one 3D printed bond insulator preventing electrical conduction between a 3D printed bond conductor and at least one of the modified extracted die, interposer, and package base, wherein the at least one 3D printed bond insulator separates the 3D printed bond conductors from conductive surfaces of the modified extracted die, interposer, package base, or other 3D printed bond conductors.

19. The integrated circuit of claim 18, wherein the at least one 3D printed bond insulator covers at least a portion of a first 3D printed bond conductor and prevents electrical conduction between the first 3D printed bond conductor and a second 3D printed bond conductor above and conformal with the at least one 3D printed bond insulator.

* * * * *